United States Patent
Balevi et al.

(10) Patent No.: US 12,255,714 B2
(45) Date of Patent: Mar. 18, 2025

(54) TECHNIQUES FOR ENCODING AND DECODING A CHANNEL BETWEEN WIRELESS COMMUNICATION DEVICES

(71) Applicant: QUALCOMM Incorporated, San Diego, CA (US)

(72) Inventors: Eren Balevi, San Diego, CA (US); Taesang Yoo, San Diego, CA (US); June Namgoong, San Diego, CA (US); Kirty Prabhakar Vedula, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 527 days.

(21) Appl. No.: 17/672,525

(22) Filed: Feb. 15, 2022

(65) Prior Publication Data
US 2023/0261712 A1  Aug. 17, 2023

(51) Int. Cl.
*H04B 7/06* (2006.01)
*H04L 1/00* (2006.01)

(52) U.S. Cl.
CPC ......... *H04B 7/0626* (2013.01); *H04B 7/0658* (2013.01); *H04L 1/0009* (2013.01)

(58) Field of Classification Search
None
See application file for complete search history.

(56) References Cited

U.S. PATENT DOCUMENTS

2013/0336214 A1* 12/2013 Sayana ................. H04L 5/0048
                                                    370/328
2024/0088965 A1*  3/2024 Kheirkhah Sangdeh ....................
                                                    H04B 7/0626

FOREIGN PATENT DOCUMENTS

CN         113098804 A  *  7/2021  .......... H04B 7/0413
WO   WO-2022061936 A1  *  3/2022

OTHER PUBLICATIONS

Yang et al. "Distributed Deep Convolutional Compression for Massive MIMO CSI Feedback" (Year: 2021).*
International Search Report and Written Opinion—PCT/US2023/060095—ISA/EPO—Mar. 30, 2023.
(Continued)

*Primary Examiner* — Jamaal Henson
(74) *Attorney, Agent, or Firm* — Holland & Hart LLP

(57) ABSTRACT

Methods, systems, and devices for wireless communications are described. A user equipment (UE) may encode channel state feedback (CSF) information to compress the CSF information to a first encoding output associated with a first dimensional space, and apply entropy coding to the first encoding output of the channel state feedback information. The entropy coding may transform the first encoding output to a second encoding output associated with a second dimensional space that is smaller than the first dimensional space of the first encoding output. The UE may transmit a CSF message comprising the second encoding output. A network device may receive the CSF message and apply entropy decoding to the compressed CSF information to partially decompress the compressed CSF information to a first decoding output. The network device may decode the first decoding output to completely decompress the compressed CSF information to a second decoding output.

24 Claims, 17 Drawing Sheets

(56) References Cited

OTHER PUBLICATIONS

Mashhadi M.B., et al., "Distributed Deep Convolutional Compression for Massive MIMO CSI Feedback", IEEE Transactions on Wireless Communications, IEEE Service Center, Piscataway, NJ, US, vol. 20, No. 4, Dec. 16, 2020, XP011848820, pp. 2621-2633, Abstract, Section I "Introduction", Section 2 "System Model", section III "DeepCMC", p. 2621-p. 2625, figure 1.
Ravula S., et al., "Deep Autoencoder-based Massive MIMO CSI Feedback with Quantization and Entropy Coding", 2021 IEEE Global Communications Conference (GLOBECOM), Dec. 7, 2021, XP034073851, 6 pages, Abstract, Section I Introduction, Section III Model, p. 1-p. 4, figures 1-3.
Yang Q., et al., "Deep Convolutional Compression for Massive MIMO CSI Feedback", 2019 IEEE 29th International Workshop on Machine Learning for Signal Processing (MLSP), Oct. 13, 2019, XP033645807, 8 pages, Abstract section 1 "Introduction", Section 2 "System Model", Section 3 "DeepCMC", p. 1-p. 4, Sections II-II; p. 2-p. 4p. 5, left-hand column, line 3—right-hand column, line 19; table 2, figures 1-3.

\* cited by examiner

TECHNIQUES FOR ENCODING AND DECODING A CHANNEL BETWEEN WIRELESS COMMUNICATION DEVICES

FIELD OF TECHNOLOGY

The following relates to wireless communications, including techniques for encoding and decoding a channel between wireless communication devices.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more network devices or one or more network access nodes, each simultaneously supporting communication for multiple communication devices, which may be otherwise known as user equipment (UE).

In some wireless communications systems, wireless devices may communicate with one another, where the communications may include a compressed signal. For example, a transmitting device may compress a signal and may transmit the compressed signal to a receiving device. Upon receiving the compressed signal, the receiving device may perform a procedure to obtain the original, non-compressed signal. Signal compression and decompression techniques may be improved.

SUMMARY

The described techniques relate to improved methods, systems, devices, and apparatuses that support techniques for encoding and decoding communications between wireless communication devices. Generally, the described techniques provide for improved methods of compressing and decompressing a message, such as a channel estimate or channel state feedback (CSF), communicated between devices. In some cases, a transmitting device (e.g., a user equipment (UE), or some other network entity) may be configured with one or more encoders to use for compressing messages, and a receiving device (e.g., a network device) may be configured with a decoder (e.g., a universal decoder, global decoder) for use in decompressing messages from one or more transmitting devices, from one or more encoders, or a combination thereof. For example, a UE may compress a message using an encoder of the UE and the UE may transmit the compressed message to a network device. The network device may receive multiple compressed messages from multiple UEs and/or encoders (e.g., encoders of a single UE, encoders of multiple UEs) and the network device may use the universal decoder to decompress the multiple messages.

In some cases, the transmitting device, the receiving device or both may be configured to perform a multi-step compression and decompression procedure, respectively. For example, a UE may encode CSF information associated with the UE to compress the CSF information to a first encoding output associated with a first dimensional space, and the UE may apply entropy coding to the first encoding output of the CSF information. The entropy coding may transform the first encoding output to a second encoding output associated with a second dimensional space that is smaller than the first dimensional space of the first encoding output. The UE may transmit a CSF message including the second encoding output. In some cases, a network device may receive a CSF message including compressed CSF information associated with a first dimensional space. The network device may apply entropy decoding to the compressed CSF information to partially decompress the compressed CSF information to a first decoding output associated with a second dimensional space. The second dimensional space may be larger than the first dimensional space. The network device may then decode the first decoding output to completely decompress the compressed CSF information to a second decoding output associated with a third dimensional space, where the third dimensional space may be larger than the second dimensional space of the first decoding output.

A method for wireless communications at a UE is described. The method may include encoding CSF information (e.g., channel state information (CSI) feedback) associated with the UE to compress the CSF information to a first encoding output associated with a first dimensional space, applying entropy coding to the first encoding output of the CSF information, where the entropy coding transforms the first encoding output to a second encoding output associated with a second dimensional space that is smaller than the first dimensional space of the first encoding output, and transmitting a CSF message including the second encoding output.

An apparatus for wireless communications at a UE is described. The apparatus may include a processor, memory coupled with the processor, and instructions stored in the memory. The instructions may be executable by the processor to cause the apparatus to encode CSF information associated with the UE to compress the CSF information to a first encoding output associated with a first dimensional space, apply entropy coding to the first encoding output of the CSF information, where the entropy coding transforms the first encoding output to a second encoding output associated with a second dimensional space that is smaller than the first dimensional space of the first encoding output, and transmit a CSF message including the second encoding output.

Another apparatus for wireless communications at a UE is described. The apparatus may include means for encoding CSF information associated with the UE to compress the CSF information to a first encoding output associated with a first dimensional space, means for applying entropy coding to the first encoding output of the CSF information, where the entropy coding transforms the first encoding output to a second encoding output associated with a second dimensional space that is smaller than the first dimensional space of the first encoding output, and means for transmitting a CSF message including the second encoding output.

A non-transitory computer-readable medium storing code for wireless communications at a UE is described. The code may include instructions executable by a processor to encode CSF information associated with the UE to compress the CSF information to a first encoding output associated with a first dimensional space, apply entropy coding to the first encoding output of the CSF information, where the entropy coding transforms the first encoding output to a second encoding output associated with a second dimensional space that is smaller than the first dimensional space of the first encoding output, and transmit a CSF message including the second encoding output.

Some examples of the method, apparatuses, and non-transitory computer-readable medium described herein may further include operations, features, means, or instructions for receiving an indication of a size of the first dimensional space, where the UE encodes the CSF information based on the indication.

Some examples of the method, apparatuses, and non-transitory computer-readable medium described herein may further include operations, features, means, or instructions for receiving an indication of a size of the second dimensional space, where the UE applies the entropy coding to the first encoding output based on the indication.

Some examples of the method, apparatuses, and non-transitory computer-readable medium described herein may further include operations, features, means, or instructions for receiving an indication of an entropy coding technique, where the UE applies the entropy coding to the first encoding output based on the indication.

In some examples of the method, apparatuses, and non-transitory computer-readable medium described herein, the entropy coding technique may be a machine-learning based technique and the machine-learning based technique includes training a set of one or more parameters with a dataset associated with the set of one or more parameters.

In some examples of the method, apparatuses, and non-transitory computer-readable medium described herein, the entropy coding technique may be trained together with an encoder of the UE and a universal decoder of a network device.

In some examples of the method, apparatuses, and non-transitory computer-readable medium described herein, the entropy coding technique may be trained separately from an encoder of the UE, a universal decoder of a network device, or both.

In some examples of the method, apparatuses, and non-transitory computer-readable medium described herein, the UE may be configured with one or more encoders for encoding the CSF information, the one or more encoders each configured to be compatible with a universal decoder at a network device.

In some examples of the method, apparatuses, and non-transitory computer-readable medium described herein, each encoder of the one or more encoders may be implemented by a neural network that utilizes machine-learning to compress the CSF information to the first encoding output.

In some examples of the method, apparatuses, and non-transitory computer-readable medium described herein, each of the one or more encoders may be associated with a different channel model, or corresponds to a different set of antenna ports, or corresponds to a different set of antenna panels, or a combination thereof.

Some examples of the method, apparatuses, and non-transitory computer-readable medium described herein may further include operations, features, means, or instructions for transmitting, to a network device, an indication of an index associated with the UE for the network device to use in decoding the CSF message.

Some examples of the method, apparatuses, and non-transitory computer-readable medium described herein may further include operations, features, means, or instructions for transmitting, to a network device, an indication of a context vector for the network device to use in decoding the CSF message, the context vector associated with one or more parameters of the UE.

In some examples of the method, apparatuses, and non-transitory computer-readable medium described herein, each point of the first dimensional space, the second dimensional space, or a combination thereof, maps to the CSF information in a dimensional space larger than the first dimensional space.

Some examples of the method, apparatuses, and non-transitory computer-readable medium described herein may further include operations, features, means, or instructions for estimating a channel between the UE and a network device, where the CSF information may be based at least on part on estimating the channel.

A method for wireless communications at a network device is described. The method may include receiving a CSF message including compressed CSF information associated with a first dimensional space, applying entropy decoding to the compressed CSF information to partially decompress the compressed CSF information to a first decoding output associated with a second dimensional space, where the second dimensional space is larger than the first dimensional space, and decoding the first decoding output to completely decompress the compressed CSF information to a second decoding output associated with a third dimensional space, the third dimensional space larger than the second dimensional space of the first decoding output.

An apparatus for wireless communications at a network device is described. The apparatus may include a processor, memory coupled with the processor, and instructions stored in the memory. The instructions may be executable by the processor to cause the apparatus to receive a CSF message including compressed CSF information associated with a first dimensional space, apply entropy decoding to the compressed CSF information to partially decompress the compressed CSF information to a first decoding output associated with a second dimensional space, where the second dimensional space is larger than the first dimensional space, and decode the first decoding output to completely decompress the compressed CSF information to a second decoding output associated with a third dimensional space, the third dimensional space larger than the second dimensional space of the first decoding output.

Another apparatus for wireless communications at a network device is described. The apparatus may include means for receiving a CSF message including compressed CSF information associated with a first dimensional space, means for applying entropy decoding to the compressed CSF information to partially decompress the compressed CSF information to a first decoding output associated with a second dimensional space, where the second dimensional space is larger than the first dimensional space, and means for decoding the first decoding output to completely decompress the compressed CSF information to a second decoding output associated with a third dimensional space, the third dimensional space larger than the second dimensional space of the first decoding output.

A non-transitory computer-readable medium storing code for wireless communications at a network device is described. The code may include instructions executable by a processor to receive a CSF message including compressed CSF information associated with a first dimensional space, apply entropy decoding to the compressed CSF information to partially decompress the compressed CSF information to a first decoding output associated with a second dimensional space, where the second dimensional space is larger than the first dimensional space, and decode the first decoding output to completely decompress the compressed CSF information to a second decoding output associated with a third dimensional space, the third dimensional space larger than the second dimensional space of the first decoding output.

Some examples of the method, apparatuses, and non-transitory computer-readable medium described herein may further include operations, features, means, or instructions for transmitting an indication of a dimensional size of an output of an encoder of a UE.

Some examples of the method, apparatuses, and non-transitory computer-readable medium described herein may further include operations, features, means, or instructions for transmitting an indication of a dimensional size of an output of an entropy coding procedure to be performed by a UE, where the first dimensional space of the compressed CSF information received by the network device may be based on the dimensional size.

Some examples of the method, apparatuses, and non-transitory computer-readable medium described herein may further include operations, features, means, or instructions for transmitting an indication of an entropy coding technique for a UE to apply to an output of an encoder of the UE.

In some examples of the method, apparatuses, and non-transitory computer-readable medium described herein, the entropy coding technique may be a machine-learning based technique and the machine-learning based technique includes training a set of one or more parameters with a dataset associated with the set of one or more parameters.

In some examples of the method, apparatuses, and non-transitory computer-readable medium described herein, the entropy coding technique may be trained together with the encoder of the UE and a universal decoder of the network device.

In some examples of the method, apparatuses, and non-transitory computer-readable medium described herein, the entropy coding technique may be trained separately from the encoder of the UE, a universal decoder of the network device, or both.

In some examples of the method, apparatuses, and non-transitory computer-readable medium described herein, the network device may be configured with a universal decoder for decoding CSF information output from different encoders, the universal decoder compatible with each of the different encoders.

In some examples of the method, apparatuses, and non-transitory computer-readable medium described herein, the universal decoder may be trained based on one or more defined inputs and one or more defined outputs for the universal decoder.

In some examples of the method, apparatuses, and non-transitory computer-readable medium described herein, the universal decoder may be configured based on one or more parameters defined for the universal decoder.

In some examples of the method, apparatuses, and non-transitory computer-readable medium described herein, the universal decoder may be implemented by a neural network that utilizes machine-learning to decompress the compressed CSF information to the second decoding output.

In some examples of the method, apparatuses, and non-transitory computer-readable medium described herein, decoding the first decoding output may include operations, features, means, or instructions for decoding the first decoding output by concatenating the first decoding output with an index associated with a UE.

Some examples of the method, apparatuses, and non-transitory computer-readable medium described herein may further include operations, features, means, or instructions for receiving an indication of the index associated with the UE for the network device to use in decoding the first decoding output.

Some examples of the method, apparatuses, and non-transitory computer-readable medium described herein may further include operations, features, means, or instructions for identifying the index associated with the UE for the network device to use in decoding the first decoding output, where identifying the index may be based on a set of one or more resources over which the CSF message may be received by the network device.

In some examples of the method, apparatuses, and non-transitory computer-readable medium described herein, decoding the first decoding output may include operations, features, means, or instructions for decoding the first decoding output by concatenating the first decoding output with a context vector, the context vector associated with one or more parameters of a UE.

Some examples of the method, apparatuses, and non-transitory computer-readable medium described herein may further include operations, features, means, or instructions for receiving an indication of the context vector for the network device to use in decoding the CSF message.

In some examples of the method, apparatuses, and non-transitory computer-readable medium described herein, each point of the first dimensional space, the second dimensional space, or a combination thereof maps to the second decoding output of the third dimensional space.

DETAILED DESCRIPTION

Figure 1:
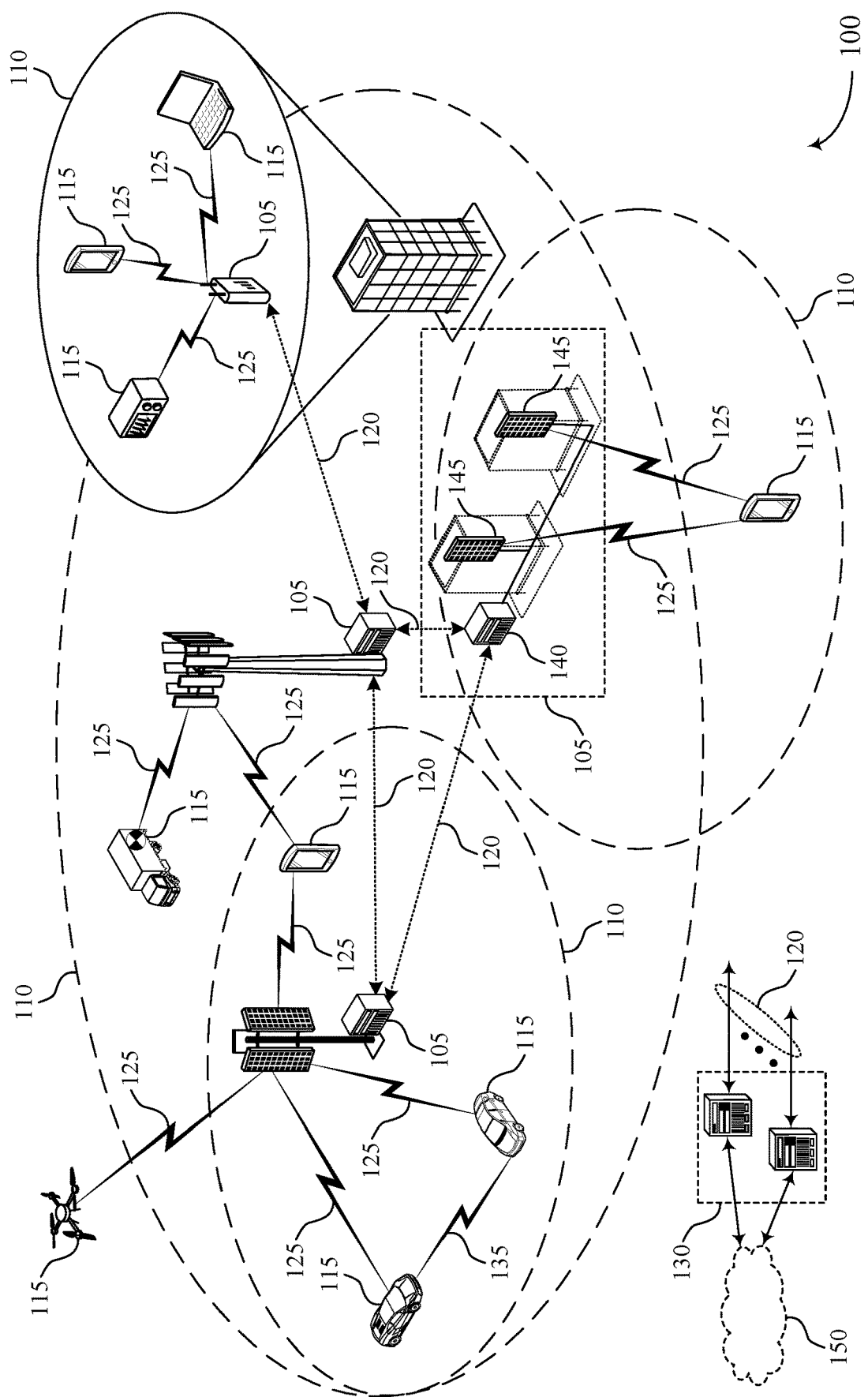
FIG. 1 illustrates an example of a wireless communications system that supports techniques for encoding and decoding a channel between wireless communication devices in accordance with one or more aspects of the present disclosure.

In some wireless communication systems, a user equipment (UE) may be configured to perform a channel estimation procedure between the UE and another device, such as a network device. The UE may be configured to transmit channel state feedback (CSF) information, H, to the network device. However, CSF information may result in large overhead at the UE and network and so to decrease the overhead, the UE and network device may utilize coding techniques (e.g., an autoencoder, a neural network) to compress and decompress the CSF information, respectively. For example, a UE may be configured with an encoder (of an autoencoder, a neural network) for compressing CSF information, H, to a compressed form, h. The CSF information, H, may be associated with a first dimensional space greater than a second dimensional space that is associated with the compressed CSF, h. The UE may then transmit the compressed CSF, h, to the network device with reduced overhead.

The network device may be configured with a decoder (of an autoencoder) corresponding to the encoder of the UE, and so upon receiving the compressed CSF, h, the network device may decompress (e.g., reconstruct) h via the decoder to obtain the original CSF, H. In such cases, encoders and decoders may be paired such that for every encoder at a UE, the network device is configured with a corresponding decoder. The amount of compression and decompression performed by the encoder and decoder pair may be fixed. For example, compressing the CSF, H, from the first dimensional size, to the second dimensional size may be fixed. In some implementations, the amount of compression may be variable. For example, encoder and decoder architectures may be configured to support variable compression and decompression ratios, respectively. In some cases, each UE may have one or more encoders, and different UEs may have different encoders. Accordingly, a network device may be configured with a large number of decoders and may switch between the decoders each time the network device receives a compressed channel estimation from a different encoder resulting in increased complexity at the network device.

To improve compression techniques, a network device may be configured with a decoder (e.g., a universal decoder, a global decoder) that is compatible with multiple or all types of encoders. In order to enhance the performance of the universal decoder, the input dimension of the universal decoder may be increased. Increasing the size of the input to the universal decoder may relax the task of the universal decoder as the universal decoder may have more information to determine the original CSF, H. In order to increase the input to the universal decoder while minimizing the increase of the size of the transmission between the UE and network device, the UE and network device may be configured to perform a multi-step compression and decompression procedure, respectively.

In an example of a multi-step compression procedure, each encoder may still be configured to compress the channel, but the compression may not be as low as in the case that the network device has an individual decoder for each encoder. For example, rather than compressing the CSF information, H, associated with the first dimensional space to a second dimensional space, as described, the UE may instead be configured to compress the CSF information, H, to a third dimensional space that is smaller than the first dimensional space, but larger than the second dimensional space. The third dimensional space may be referred to as a global unified low-dimensional space. Then, to further increase the compression of the channel feedback, such as to the second dimensional space, a UE may apply entropy coding to the output of the encoder, such that the encoder may result in a first compression of the channel, and the entropy coding may result in a second, smaller, compression of the channel. The UE may then transmit the second compression, h, to the network device. The network device may receive the compressed channel, h, and may apply a corresponding entropy decoding procedure to the compressed channel. The entropy decoding may result in the third dimensional space. The network device may then input the output of the entropy decoder into the universal decoder to reconstruct the original channel, H.

In some cases, the network device may concatenate the output of the entropy decoder, $h_k$, by a UE index (k) or by a context vector ($c_k$) associated with the UE to aid in computation of the original channel, H, for the universal decoder. As the UE index, and/or the context vector provide the universal decoder with additional information of the UE, the task performed by the universal decoder may be further simplified. Operating a network device with one entropy decoder per UE entropy coder to allow for the implementation of a universal decoder may result in less complexity and overhead than configuring the network device with one decoder per encoder. Accordingly, the UE and network device may continue to achieve reduced signaling overhead by compressing the channel transmitted between the UE and the network device, while mitigating complexity at the network device.

Particular aspects of the subject matter described herein may be implemented to realize one or more advantages. The described techniques may support improvements in transmitting and receive CSF information by decreasing signaling overhead, reducing computational complexity at a network device, among other advantages. As such, supported techniques may include improved network operations and, in some examples, may promote network efficiencies, among other benefits.

Aspects of the disclosure are initially described in the context of wireless communications systems. Aspects are then described with reference to a process flow. Aspects of the disclosure are further illustrated by and described with reference to apparatus diagrams, system diagrams, and flowcharts that relate to techniques for encoding and decoding a channel between wireless communication devices.

FIG. 1 illustrates an example of a wireless communications system 100 that supports techniques for encoding and decoding a channel between wireless communication devices in accordance with one or more aspects of the present disclosure. The wireless communications system 100 may include one or more network devices 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable communications, low latency communications, communications with low-cost and low-complexity devices, or any combination thereof.

The network devices 105 may be dispersed throughout a geographic area to form the wireless communications system 100 and may be devices in different forms or having different capabilities. The network devices 105 and the UEs 115 may wirelessly communicate via one or more communication links 125. Each network device 105 may provide a coverage area 110 over which the UEs 115 and the network device 105 may establish one or more communication links 125. The coverage area 110 may be an example of a geographic area over which a network device 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the network devices 105, or network equipment (e.g., core network nodes, relay devices, integrated access and backhaul (IAB) nodes, or other network equipment), as shown in FIG. 1.

In some examples, one or more components of the wireless communications system 100 may operate as or be referred to as a network node. As used herein, a network node may refer to any UE 115, network device 105, entity of a core network 130, apparatus, device, or computing system configured to perform any techniques described herein. For example, a network node may be a UE 115. As another example, a network node may be a network device 105. As another example, a first network node may be configured to communicate with a second network node or a third network node. In one aspect of this example, the first network node may be a UE 115, the second network node may be a network device 105, and the third network node may be a UE 115. In another aspect of this example, the first network node may be a UE 115, the second network node may be a network device 105, and the third network node may be a network device 105. In yet other aspects of this example, the first, second, and third network nodes may be different. Similarly, reference to a UE 115, a network device 105, an apparatus, a device, or a computing system may include disclosure of the UE 115, network device 105, apparatus, device, or computing system being a network node. For example, disclosure that a UE 115 is configured to receive information from a network device 105 also discloses that a first network node is configured to receive information from a second network node. In this example, consistent with this disclosure, the first network node may refer to a first UE 115, a first network device 105, a first apparatus, a first device, or a first computing system configured to receive the information; and the second network node may refer to a second UE 115, a second network device 105, a second apparatus, a second device, or a second computing system.

The network devices 105 may communicate with the core network 130, or with one another, or both. For example, the network devices 105 may interface with the core network 130 through one or more backhaul links 120 (e.g., via an S1, N2, N3, or other interface). The network devices 105 may communicate with one another over the backhaul links 120 (e.g., via an X2, Xn, or other interface) either directly (e.g., directly between network devices 105), or indirectly (e.g., via core network 130), or both. In some examples, the backhaul links 120 may be or include one or more wireless links.

One or more of the network devices 105 described herein may include or may be referred to by a person having ordinary skill in the art as a base transceiver station, a radio network device, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network devices 105 and the network equipment including macro eNBs or gNBs, small cell eNBs or gNBs, or relay network devices, among other examples, as shown in FIG. 1.

The UEs 115 and the network devices 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the network devices 105 or the UEs 115 may be expressed in multiples of a basic time unit which may, for example, refer to a sampling period of $T_s = 1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network device 105 may be movable and therefore provide communication coverage for a moving geographic coverage area 110. In some examples, different geographic coverage areas 110 associated with different technologies may overlap, but the different geographic coverage areas 110 may be supported by the same network device 105. In other examples, the overlapping geographic coverage areas 110 associated with different technologies may be supported by different network devices 105. The wireless communications system 100 may include, for example, a heterogeneous network in which different types of the network devices 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a network device 105. Other UEs 115 in such a group may be outside the geographic coverage area 110 of a network device 105 or be otherwise unable to receive transmissions from a network device 105. In some examples, groups of the UEs 115 communicating via D2D communications may utilize a one-to-many (1:M) system in which each UE 115 transmits to every other UE 115 in the group. In some examples, a network device 105 facilitates the scheduling of resources for D2D communications. In other cases, D2D communications are carried out between the UEs 115 without the involvement of a network device 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network devices 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a network device 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or network device 105 may be distributed across various network devices (e.g., radio heads and ANCs) or consolidated into a single network device (e.g., a network device 105).

As described herein, a network device 105 may include one or more components that are located at a single physical location or one or more components located at various physical locations, and any one or more of such components may be referred to herein as a network entity. In examples in which the network device 105 includes components that are located at various physical locations, the various components may each perform various functions such that, collectively, the various components achieve functionality that is similar to a network device 105, such as a base station, that is located at a single physical location. As such, a network device 105 or network entity described herein may equivalently refer to a standalone network device (also known as a monolithic network device) or a network device 105 including network entity components that are located at various physical locations or virtualized locations (also known as a disaggregated network device 105). In some implementations, such a network device 105 including network entity components that are located at various physical locations may be referred to as or may be associated with a disaggregated radio access network (RAN) architecture, such as an Open RAN (O-RAN) or Virtualized RAN (VRAN) architecture. In some implementations, such network entity components of a network device 105 may include or refer to one or more of a central unit (or centralized unit CU), a distributed unit (DU), or a radio unit (RU).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the network devices 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network device 105 or a UE 115 may be equipped with multiple antennas, which may be used to employ techniques such as transmit diversity, receive diversity, multiple-input multiple-output (MIMO) communications, or beamforming. The antennas of a network device 105 or a UE 115 may be located within one or more antenna arrays or antenna panels, which may support MIMO operations or transmit or receive beamforming. For example, one or more network device antennas or antenna arrays may be co-located at an antenna assembly, such as an antenna tower. In some examples, antennas or antenna arrays associated with a network device 105 may be located in diverse geographic locations. A network device 105 may have an antenna array with a number of rows and columns of antenna ports that the network device 105 may use to support beamforming of communications with a UE 115. Likewise, a UE 115 may have one or more antenna arrays that may support various MIMO or beamforming operations. Additionally, or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a network device 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In some wireless communications systems, such as wireless communication systems 100, a UE 115, or some other network entity, may encode CSF information associated with the UE 115 to compress the CSF information to a first encoding output associated with a first dimensional space, and the UE 115 may apply entropy coding to the first encoding output of the CSF information. The entropy coding may transform the first encoding output to a second encoding output associated with a second dimensional space that is smaller than the first dimensional space of the first encoding output. The UE 115 may transmit a CSF message including the second encoding output. In some cases, a network device 105 may receive a CSF message including compressed CSF information associated with a first dimensional space. The network device 105 may apply entropy decoding to the compressed CSF information to partially decompress the compressed CSF information to a first decoding output associated with a second dimensional space. The second dimensional space may be larger than the first dimensional space. The network device 105 may then decode the first decoding output to completely decompress the compressed CSF information to a second decoding output associated with a third dimensional space, where the third dimensional space may be larger than the second dimensional space of the first decoding output.

Figure 2:
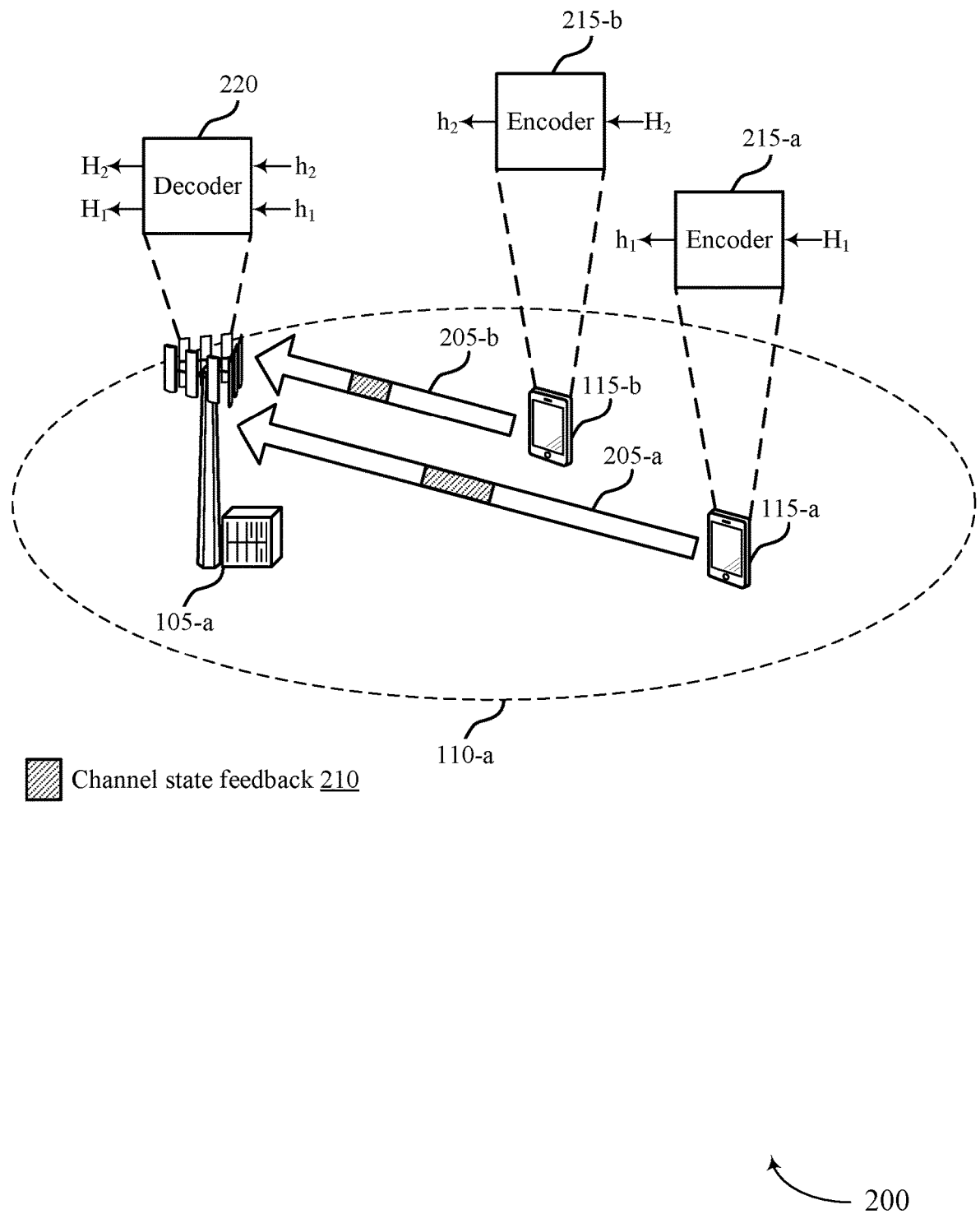
FIGS. 2 through 4 illustrate examples of wireless communications systems that support techniques for encoding and decoding a channel between wireless communication devices in accordance with aspects of the present disclosure.

FIG. 2 illustrates an example of a wireless communications system 200 that supports techniques for encoding and decoding a channel between wireless communication devices in accordance with aspects of the present disclosure. The wireless communications system 200 may include network device 105-a and UEs 115-a, and 115-b, which may be examples of a network device 105 and UEs 115 as described with reference to FIG. 1. Network device 105 may serve a geographic coverage area 110-a. In some cases, a network device 105 may be configured with a universal decoder 220 for decompressing messages from multiple UEs 115, and/or different encoders. In some cases, UEs 115-a and/or 115-b and network device 105-a may be configured to perform entropy coding techniques based on the universal decoder 220 at network device 105-a. Additionally, or alternatively, other wireless devices, such as UEs 115 may be configured with a universal decoder 220.

Devices may be configured to communicate with one another via communication links 205 (e.g., uplink communication links, downlink communication links, sidelink communication links), which may be a representation of beams, channels, etc. In some cases, devices communicating with one another may be configured to identify a channel between the devices. For example, UE 115-a, network device 105-a, or both may perform a channel estimation procedure to identify a channel between UE 115-a and network device 105-a. For example, UE 115-a may be configured to receive one or more signals from network device 105-a (e.g., known signals, such as reference signals). As the signals are transmitted over the channel between UE 115-a and network device 105-a, the signals may get distorted (e.g., attenuated, phase-shifted, noised), such as due to other signals transmitted over the same or similar channel, environmental, factors, etc. Accordingly, UE 115-a may receive the one or more signals and compare them to one or more known signals (e.g., the original transmitted signals). UE 115-a may be configured to identify a correlation between the one or more know signals to the one or more received signals, where the signals may be represented by an array (e.g., a matrix) of information. In some cases, UE 115-a may be configured to transmit CSF information (e.g., channel state information (CSI) feedback, CSF 210), H, to the network device 105-a so as to indicate the channel condition between UE 115-a and network device 105-a. In some cases, UE 115-b may perform a same or similar procedure with network device 105-a.

Transmitting CSF 210 may result in large overhead at the UE 115 and network device 105 due to the large amount of information transmitted between the UE 115 and the network device 105 such as due to communicating in a large bandwidth, communicating with a high number of antenna elements, etc. To decrease the overhead, the UE 115 and network device 105 may utilize coding techniques to compress and decompress the CSF information, respectively. In some cases, the encoding techniques may include an autoencoder (e.g., implemented by a neural network). An autoencoder may compress input data by representing the input with lower-dimensional features, where the autoencoder may "learn" to do so via machine learning training. For example, a UE 115 may be configured with an encoder 215 of an autoencoder for compressing CSF information, H, to a compressed form, h. The CSF information, H, may be associated with a first dimensional space greater than a second dimensional space that is associated with the compressed CSF, h, due to the compression. The UE 115 may then transmit the compressed CSF, h, to the network device 105 with reduced overhead. Feeding back the compressed channel, h, instead of the original high-dimensional channel may considerably conserve uplink resources (e.g., uplink control channel resources, uplink data resources), particularly while communicating in a high bandwidth, communicating via a large number of antennas, etc.

The network device 105 may be configured with a decoder 220 of the autoencoder corresponding the encoder 215 of the UE 115, and so upon receiving the compressed CSF, h, the network device 105 may decompress (e.g., reconstruct) h via the decoder 220 to obtain the original CSF, H. In some cases, encoders 215 and decoders 220 are paired such that for every encoder 215 at a UE 115, the network device 105 may be configured with a corresponding decoder 220, where the amount of compression and decompression performed by the encoder and decoder pair may be fixed. For example, compressing the CSF, H, from the first dimensional size, to the second dimensional size may be fixed. In some implementations, the amount of compression may be variable. For example, encoder and decoder architectures may be configured to support variable compression and decompression ratios, respectively. In some cases, each UE 115 may have one or more encoders 215, and different UEs 115 may have different encoders 215. For example, a UE 115 may be configured with an encoder 215 based on the type of UE 115. Accordingly, two different types of UEs 115 may be configured with two different encoders 215. Therefore, the network device 105 would maintain two different decoders 220 corresponding to the two different encoders 215. Accordingly, in some cases, a network device 105 may be configured with a large number of decoders 220. Additionally, the network device 105 may switch between the many decoders 220 each time the network device 105 receives a compressed channel estimation from a different encoder 215 resulting in increased complexity, and increased latency at the network device 105.

To improve compression techniques, a network device 105 may be configured with a decoder 220 (e.g., a universal decoder, a global decoder) that is compatible with multiple or all types of encoders. For example, in some cases, the network device 105 may be configured with a single universal decoder 220 (e.g., a single neural network) irrespective of the number of UEs 115, and/or encoders 215 the network device 105 is communicating with. For example, UE 115-a may compress a channel, $H_1$ to lower-dimensional form, $h_1$, via encoder 215-a. UE 115-a may transmit the lower-dimensional state, $h_1$, of the CSF 210 to network device 105-a via communication link 205-a. Similarly, UE 115-b may compress a channel, Hz to lower-dimensional form, $h_2$, via encoder 215-b. UE 115-b may transmit the lower-dimensional state, $h_2$, of the CSF 210 to network device 105-a via communication link 205-b. Network device 105-a may be configured with universal decoder 220 that network device 105-a may use to decompress $h_1$ to the original, $H_1$, and decompress $h_2$ to the original, Hz.

In some cases, as described, UEs 115 may have a single unique encoder 215 that is compatible with the universal decoder 220 at the network device 105. In some other cases, UEs 115 may have more than one encoder 215 that are each compatible with the universal decoder 220. For example, each encoder 215 may correspond to a statistically different channel model (e.g., indoors, urban macro cell, urban micro cell). In another example, each encoder 215 may correspond to a set of antenna ports, a set of antenna panels, etc. Accordingly, a universal decoder 220 may enable personalized design of encoders at different UEs 115. Additionally, implementing a universal decoder 220 irrespective of the number of encoders 215 and/or UEs 115 may provide a scalable approach for reducing CSF overhead. In some cases, the encoders 215 may be designed (e.g., trained) to be compatible the universal decoder 220. In some cases, the encoders 215 may be designed via machine learning techniques that include training a set of one or more parameters with a dataset associated with the set of one or more parameters.

In order to improve the decoding performance of the universal decoder, however, the input dimension of the universal decoder 220 may be increased compared to the case in which the network device 105 is configured with decoders 220 specific to UE encoders 215, as described in more detail with reference to FIG. 3. Increasing the size of the input to the universal decoder 220 may relax the task of the universal decoder 220 as the universal decoder 220 may be provided more information to determine the original CSF, H (e.g., there is less decompression for the universal decoder 220 to do). In order to increase the input to the universal decoder 220 without increasing the size of the transmission between the UE 115 and network device 105 (e.g., while continuing to achieve the reduced overhead of the separate encoder-decoder pair scenario), the UE 115 and network device 105 may be configured to perform a multi-step compression and decompression procedure, respectively. The multi-step compression and decompression procedure may implement entropy coding, as described in more detail with reference to FIG. 4.

Figure 3:
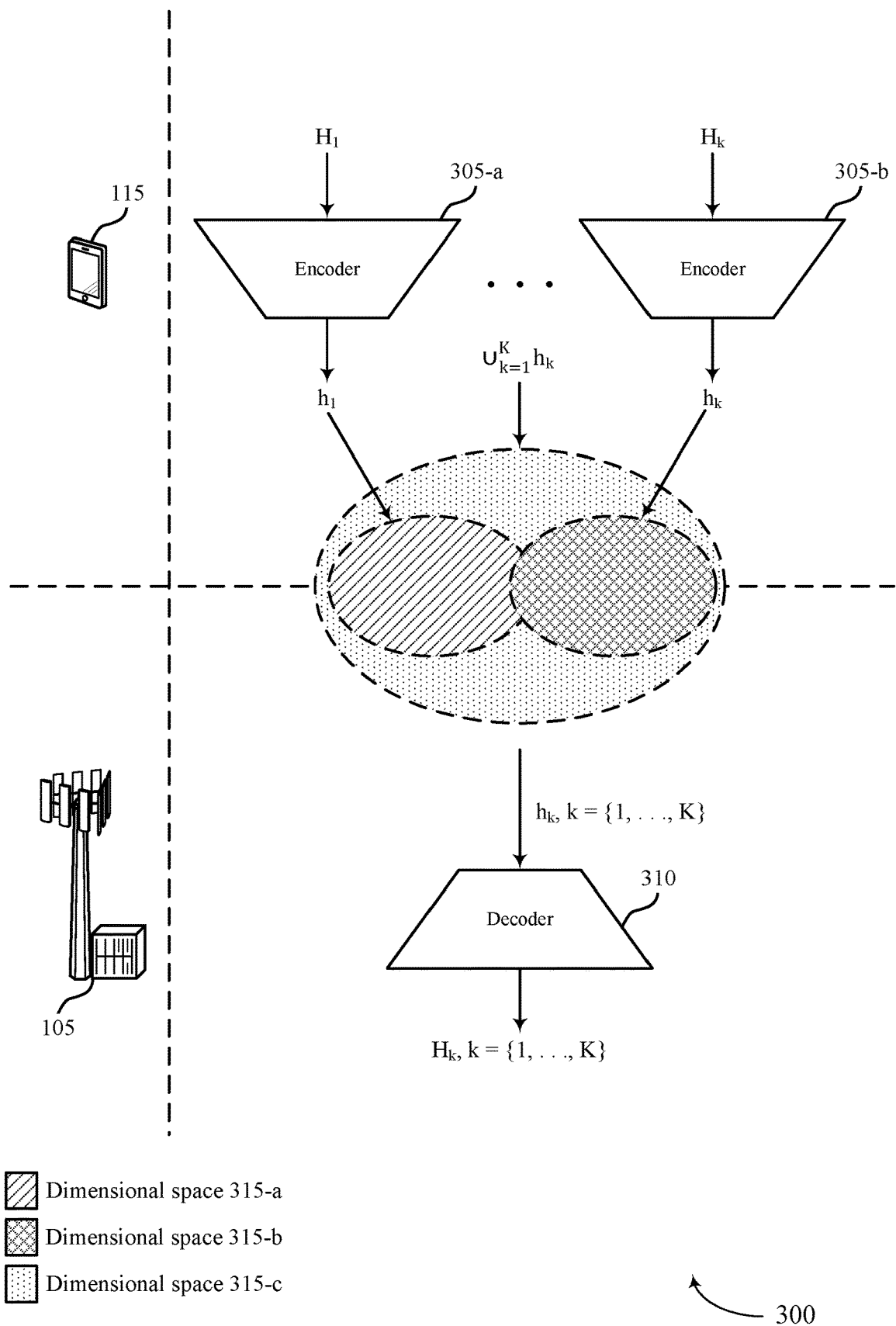

FIG. 3 illustrates an example of a wireless communications system 300 that supports techniques for encoding and decoding a channel between wireless communication devices in accordance with aspects of the present disclosure. The wireless communications system 300 may include one or more network devices 105 and one or more UE 115, which may be examples of the network devices 105 and UEs 115 as described with reference to FIGS. 1 and 2. In some cases, a network device 105 may be configured with a universal decoder 310 for decompressing messages from multiple UEs 115, and/or multiple encoders 305. In some cases, a UE 115 and a network device 105 may be configured to perform entropy coding techniques based on the universal decoder at the network device 105. Additionally, or alternatively, other wireless devices, such as a UE 115, may be configured with a universal decoder.

In some cases, a network device 105 may be configured with a specific decoder corresponding to a specific encoder 305, where each encoder 305 may be configured to compress a channel, H, to a lower dimensional form, h that occupies a dimensional space 315. For example, encoder 305-a may encode channel, $H_1$, to a compressed form, $h_1$, occupying dimensional space 315-a. The UE 115 corresponding to encoder 305-a may transmit the compressed channel, $h_1$, to the network device 105 and in the case that the network device 105 is configured with a specific decoder corresponding to encoder 305-a, the network device 105 may decompress the channel without increasing the size of the decoder that is specifically designed for encoder 305-a, or vice versa (e.g., the encoder 215 was specifically designed for the decoder). Any number, k, of UEs 115 may perform a similar procedure. For example, encoder 305-b (e.g., of a $k^{th}$ UE 115) may encode channel, $H_k$, to a compressed form, $h_k$, occupying dimensional space 315-b. The network device 105 may similarly decompress the channel, $h_k$, without increasing the size of a decoder specifically designed for encoder 305-b, or vice versa. Every point in the low-dimensional spaces (e.g., dimensional spaces 315-a, and 315-b) may be mapped to a channel in the original high-dimensional space by the decoder 310.

As described herein with reference to FIG. 2, a network device 105 may be configured with a universal decoder 310 that is compatible with one or more different UEs 115, one or more different encoders 305, or a combination thereof. For example, the universal decoder 310 may be compatible with any number of encoders 305. Therefore, the universal decoder 310 may receive any number of compressed channels (e.g., $h_k$, k={1, . . . , K}) and convert the compressed channels to original form (e.g., $H_k$, k={1, . . . , K}). In some cases, the universal decoder 310 may simultaneously decode multiple compressed signals (e.g., from the different UEs 115, from different encoders 305, or a combination thereof), or the universal decoder 310 may be configured to separately decode different compressed signals. The universal decoder 310 may be configured (e.g., trained) to reconstruct all the points of the original channel.

In order to improve the decoding performance of the universal decoder 310, the input to the universal decoder 310 may be increased compared to the case in which the network device 105 is configured with decoders specific to UE encoders 305. For example, rather than inputting a message corresponding to dimensional space 315-a and/or 315-b, the network device 105 may instead be configured to input a message corresponding to dimensional space 315-c to the universal decoder 310. Increasing the size of the input to the universal decoder 310 may relax the task of the universal decoder 310 as the universal decoder 310 may have more information to determine the original CSF, H (e.g., the universal decoder may perform less decompressing of the signal).

In some cases, the low-dimensional space 315-a and/or low-dimensional space 315-b may be increased by a factor of $\nabla$, represented by dimensional space 315-c. In some cases, the factor, $\nabla$, may be based on a union of one or more compressed channels, $h_k$, (e.g., $\cup_{k=1}^{K} h_k$). In some cases, in order to achieve the increased input to the universal decoder, the encoders 305 may be configured to compress the channel, H, in accordance with dimensional space 315-c. However, by compressing the channel, H, to dimensional space 315-c rather than to one of dimensional space 315-a or 315-b, the feedback size may increase. Therefore, in order to maintain the reduced overhead achieved by transmitting CSF in accordance with dimensional spaces 315-a and 315-b, the UEs 115 and the network device 105 may be configured to perform a multi-step compression procedure, where the multi-step compression procedure may include entropy coding.

Figure 4:
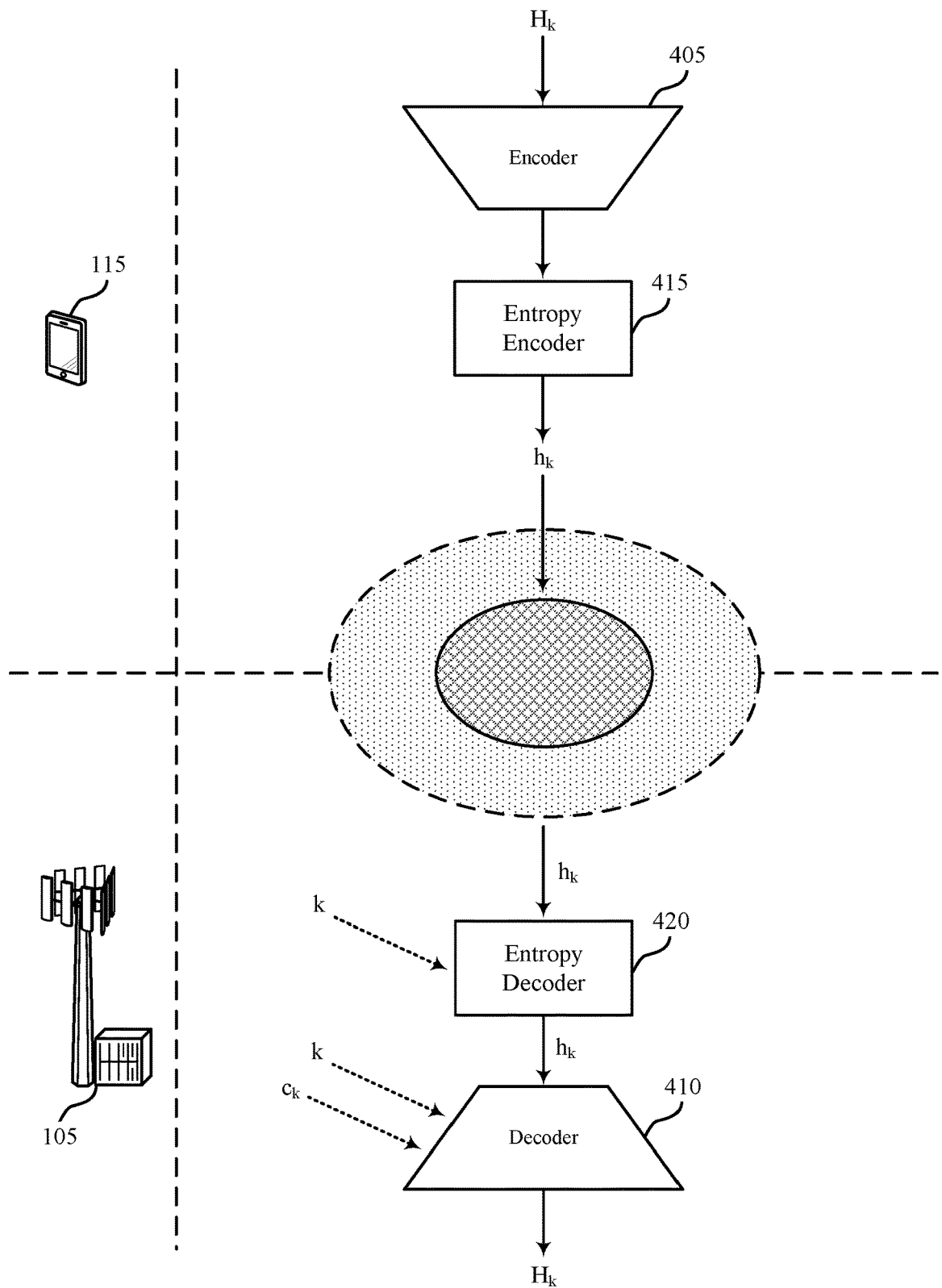

FIG. 4 illustrates an example of a wireless communications system 400 that supports techniques for encoding and decoding a channel between wireless communication devices in accordance with aspects of the present disclosure. The wireless communications system 400 may include one or more network devices 105 and one or more UE 115, which may be examples of the network devices 105 and UEs 115 as described with reference to FIGS. 1 through 3. In some cases, a network device 105 may be configured with a universal decoder for decompressing messages from multiple UEs 115, and/or multiple encoders. In some cases, a UE 115 and a network device 105 may be configured to perform entropy coding techniques based on the universal decoder at the network device 105. Additionally, or alternatively, other wireless devices, such as a UE 115, may be configured with a universal decoder.

As described herein, a UE 115 and a network device 105 may be configured to communicate CSF information between one another in accordance with a multi-step compression procedure. In an example of the multi-step compression procedure, each encoder 405 may still be configured to compress the channel, but the compression may not be as low as in the case that the network device 105 has an individual decoder for each encoder 405. For example, rather than compressing the CSF information to h of a size corresponding to dimensional space 425-a, the encoder 405 may instead be configured to compress the CSF information to h of a size corresponding to dimensional space 425-b. Dimensional space 425-b may be larger (e.g., include more dimensions) than dimensional space 425-a, but may be smaller than the original channel size, H. Dimensional space 425-b may be referred to as a global unified low-dimensional space.

To further increase the compression of the channel feedback, so as to maintain reduced transmission overhead, a UE 115 may apply entropy coding to the output of the encoder. Entropy coding may refer to a lossless data compression scheme that allows the original data to be reconstructed from the compressed data. In order to perform the entropy coding, a UE 115 may be configured with one or more entropy encoders 415 that takes the output of the encoder 405, and further compresses the channel, such as to a size associated with dimensional space 425-a. Accordingly, an encoder 405 may take the original channel, $H_k$, and may output a first compression of the channel, where the first compression may be a size associated with dimensional space 425-b. The entropy encoder 415 may output a second, smaller, compression of the channel, where the second compression may be a size associated with dimensional space 425-a. The UE 115 may then transmit the second compression, $h_k$, to the network device 105 with reduced overhead.

The network device 105 may receive the compressed channel, $h_k$, and may apply a corresponding entropy decoding technique to the compressed channel in order to obtain the increased input for the universal decoder 410. In order to perform the entropy decoding technique, the network device 105 may be configured with one or more entropy decoders 420. For example, the network device 105 may receive a compressed channel, $h_k$, associated with dimensional space 425-a. The network device 105 may input the compressed channel to an entropy decoder 420, which may partially decompress the channel to a size associated with dimensional space 425-b, for example. The network device 105 may the input the output of the entropy decoder 420 to universal decoder 410, where the universal decoder 410 may perform the rest of the decompression to fully decompress the channel, $h_k$, to the original channel, $H_k$.

In some cases, each entropy decoder 420 may be associated with a particular entropy encoder 415 at a UE 115. In such cases, operating a network device 105 with one entropy decoder 420 per UE entropy encoder 415 to implement the universal decoder 410 may result in less complexity and overhead than configuring the network device 105 with one decoder 410 per encoder 405. In some cases, an entropy decoder 420 may be compatible with all encoders at a particular UE 115, with encoders of a particular type, with UEs of a particular type, or a combination thereof. In some cases, the entropy decoder 420 may be a universal entropy decoder compatible with many entropy encoders 415.

In the case that the network device 105 is configured with one entropy decoder 420 per entropy encoder 415 (e.g., entropy coder pairs), the network device 105 may identify which entropy decoder 420 to use upon receiving a compressed channel, $h_k$. In some cases, the network device 105 may identify the entropy decoder 420 based on an index, k (e.g., a user index, UE index). The index, k, may be associated with the transmitting UE 115 and/or entropy encoder 415, and thus may also be used to identify the appropriate entropy decoder 420. For example, each entropy decoder 420 of the network device 105 may be assigned an index, k. Therefore, a first UE 115 (e.g., UE1) may compress a signal (such as via a first entropy encoder 415) and transmit the compressed signal, $h_1$, to the network device 105. The network device 105 may receive the compressed signal, $h_1$, and identify a first entropy decoder 420 (e.g., entropy decoder 1) to decompress $h_1$, where 1 is the index. In some cases, a UE 115 may transmit an indication to the network device 105 of one or more indices associated the UE 115 (e.g., in RRC, UCI, MAC-CE). In some cases, the network device 105 may identify the index associated with a received compressed channel based on the one or more resources (e.g., time resources, frequency resources) over which the network device 105 received the compressed channel. For example, a UE 115 may be scheduled to transmit in a set of resources, such as by the network device 105. The network device 105 may then determine the index based on the scheduling and the resources over which the compressed channel was received.

In some cases, the network device 105 use the UE index to aid in the decompression of the channel. For example, the network device 105 may concatenate the input and/or the output of the entropy decoder, $h_k$, by a UE index (k). For example, the entropy decoder 420 may take the encoder index k as an additional input and at least partially decompress the channel from the vector $\{k, h_k\}$. Additionally, or alternatively, the universal decoder 420 may take the encoder index k as an additional input and reconstruct the channel from the vector $\{k, h_k\}$. The vector $\{k, h_k\}$ may represent a further enlarged low-dimensional space. For example, as the UE index provides the entropy decoder 420 and/or the universal decoder 420 with additional information of the UE 115, the task performed by the entropy decoder 420 and/or the universal decoder 410 may be further simplified.

In some cases, the network device 105 use a context vector ($c_k$) (e.g., a UE specific embedding vector) to aid in the decompression of the channel. The context vector may indicate on or more additional parameters associated the transmitting UE 115. In some cases, the UE 115 may transmit the context vector to the network device 105 (e.g., in RRC, UCI, MAC-CE, etc.), and/or the network device 105 may identify the context vector. In some cases, the context vector may be fixed such that the context vector may not change even if the channel between the UE 115 and the network device 105 changes. The universal decoder 420 may takes the embedding vector $c_k$ corresponding to the encoder index k as an additional input and reconstructs the channel from the vector $\{c_k, h_k\}$. The vector $\{c_k, h_k\}$ may represent a further enlarged low-dimensional space. For example, as the context vector provides the universal decoder 420 with additional information of the UE 115, the computation performed by the universal decoder 410 may be further simplified.

The entropy coding technique may be a non-machine learning technique, or a machine-learning based technique (e.g., a neural network), where the machine-learning based technique may include training a set of one or more parameters with a dataset that is associated with the set of one or more parameters. In some cases, the entropy coding technique may be trained together with an encoder 405 of the UE 115 and/or a universal decoder 410 of a network device 105. In some cases, the entropy coding technique may be trained separately from an encoder 405 of the UE 115, a universal decoder 410 of a network device 105, or both. In some cases, the entropy encoder 415 may be separate from or a part of encoder 405. For example, in the case of neural networks, the entropy encoder 415 may be one or more layers of the encoder 405. Similarly, the entropy decoder 420 may be separate from or a part of universal decoder 410. For example, in the case of neural networks, the entropy decoder 420 may be one or more layers of the universal decoder 410. For example, the entropy encoders 415 and decoders 420 may be trained end-to-end along with the encoders 405 and the universal decoder 410.

Accordingly, the techniques described herein allow a UE 115 and network device 105 to achieve reduced signaling overhead by compressing the channel transmitted between the UE 115 and network device 105, while mitigating complexity at the network device.

In some cases, the entropy coding technique described herein may be optional, such that the network device 105 and UE 115 may perform the compression and decompression of message using an encoder 405, and the universal decoder 410, respectively. While the techniques described herein are described with reference to compressing CSF, the techniques described may be used and/or adapted for other autoencoder related communication tasks, such as end-to-end learning of the modulation and waveform for the wireless data communications, accurate positioning estimation, etc.

Figure 5:
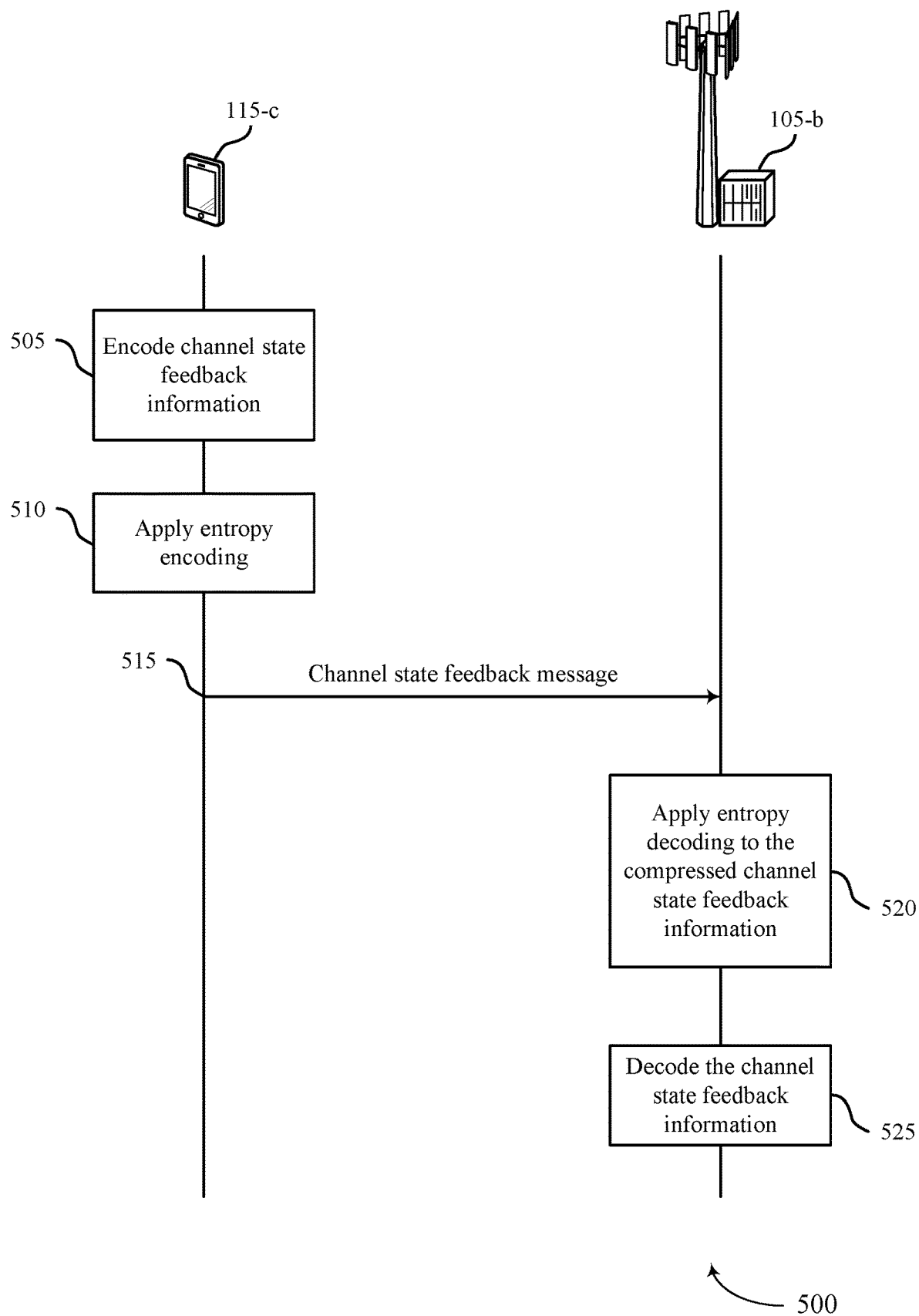
FIG. 5 illustrates an example of a process flow that supports techniques for encoding and decoding a channel between wireless communication devices in accordance with aspects of the present disclosure.

FIG. 5 illustrates an example of a process flow 500 that supports techniques for encoding and decoding a channel between wireless communication devices in accordance with aspects of the present disclosure. The process flow 500 may illustrate an example signal compression and decompression procedure between devices. For example, UE 115-c may transmit a compressed message to network device 105-b. Network device 105-b may receive the compressed message and perform a decompression procedure to obtain the original message. Network device 105-b and UE 115-c may be examples of the corresponding wireless devices described with reference to FIGS. 1 through 4. In some cases, instead of network device 105-b implementing the decompression procedure, a different type of wireless device (e.g., a UE 115) may perform a same or similar decompression procedure described herein. Similarly, instead of UE 115-c implementing the compression procedure, a different type of wireless device (e.g., a network device 105) may perform a same or similar compression procedure described herein. Alternative examples of the following may be implemented, where some steps are performed in a different order than described or are not performed at all. In some cases, steps may include additional features not mentioned below, or further steps may be added.

At 505, UE 115-c may encode CSF information associated with UE 115-c to compress the CSF information to a first encoding output associated with a first dimensional space. In some cases, UE 115-c may receive an indication of a size of the first dimensional space, where UE 115-c may encode the CSF information based on the indication. UE 115-c may estimate a channel between UE 115-c and network device 105-b, where the CSF information may be based on estimating the channel.

At 510, UE 115-c may apply entropy coding to the first encoding output of the CSF information, where the entropy coding may transform the first encoding output to a second encoding output associated with a second dimensional space that is smaller than the first dimensional space of the first encoding output. In some cases, UE 115-c may receive an indication of a size of the second dimensional space, where UE 115-c may apply the entropy coding to the first encoding output based on the indication. UE 115-c may receive an indication of an entropy coding technique, where UE 115-c may apply the entropy coding to the first encoding output based on the indication.

The entropy coding technique may be a machine-learning based technique, where the machine-learning based technique may include training a set of one or more parameters with a dataset associated with the set of one or more parameters. The entropy coding technique may be trained together with an encoder of UE 115-c and a universal decoder of a network device 105. The entropy coding technique may be trained separately from an encoder of UE 115-c, a universal decoder of a network device 105, or both. In some cases, UE 115-c may be configured with one or more encoders for encoding the CSF information, where the one or more encoders may each be configured to be compatible with a universal decoder at a network device 105. In some implementations, each encoder of the one or more encoders may be implemented by a neural network that utilizes machine-learning to compress the CSF information to the first encoding output. In some implementations, each of the one or more encoders may be associated with a different channel model, or correspond to a different set of antenna ports, or correspond to a different set of antenna panels, or a combination thereof.

Each point of the first dimensional space, the second dimensional space, or a combination thereof, may map to the CSF information in a dimensional space larger than the first dimensional space.

At 515, UE 115-c may transmit a CSF message including the second encoding output. In some cases, UE 115-c may transmit, to network device 105-b, an indication of an index associated with UE 115-c for network device 105-b to use in decoding the CSF message. In some cases, UE 115-c may transmit, to network device 105-b, an indication of a context vector for network device 105-b to use in decoding the CSF message. The context vector may be associated with one or more parameters of UE 115-c.

At 520, network device 105-b may apply entropy decoding to the compressed CSF information to partially decompress the compressed CSF information to a first decoding output associated with a second dimensional space. The second dimensional space may be larger than the first dimensional space.

At 525, network device 105-b may decode the first decoding output to completely decompress the compressed CSF information to a second decoding output associated with a third dimensional space. The third dimensional space may be larger than the second dimensional space of the first decoding output. The network device may be configured with a universal decoder for decoding CSF information output from different encoders, where the universal decoder may be compatible with each of the different encoders.

The universal decoder may be trained based on one or more defined inputs and one or more defined outputs for the universal decoder. In some cases, the universal decoder may be configured based on one or more parameters defined for the universal decoder. The universal decoder may be implemented by a neural network that utilizes machine-learning to decompress the compressed CSF information to the second decoding output.

In some cases, decoding the first decoding output may include decoding the first decoding output by concatenating the first decoding output with an index associated with UE 115-c. In some cases, 105-b may receive an indication of the index associated with UE 115-c for network device 105-b to use in decoding the first decoding output. In some cases, 105-b may identify the index associated with UE 115-c for network device 105-b to use in decoding the first decoding output. Identifying the index may be based on a set of one or more resources over which the CSF message is received by network device 105-b.

In some cases, decoding the first decoding output may include decoding the first decoding output by concatenating the first decoding output with a context vector, where the context vector may be associated with one or more parameters of UE 115-c. Network device 105-b may receive an indication of the context vector for network device 105-b to use in decoding the CSF message.

In some implementations, network device 105-b may transmit an indication of a dimensional size of an output of an encoder of UE 115-c. In some implementations, network device 105-b may transmit an indication of a dimensional size of an output of an entropy coding procedure to be performed by UE 115-c. The first dimensional space of the compressed CSF information received by network device 105-b may be based on the dimensional size. In some cases, network device 105-b may transmit an indication of an entropy coding technique for UE 115-c to apply to an output of an encoder of UE 115-c. The entropy coding technique may be a machine-learning based technique, where the machine-learning based technique may include training a set of one or more parameters with a dataset associated with the set of one or more parameters. In some cases, the entropy coding technique may be trained together with the encoder of UE 115-c and a universal decoder of network device 105-b. In some cases, the entropy coding technique may be trained separately from the encoder of UE 115-c, a universal decoder of network device 105-b, or both. Each point of the first dimensional space, the second dimensional space, or a combination thereof may maps to the second decoding output of the third dimensional space.

Figure 6:
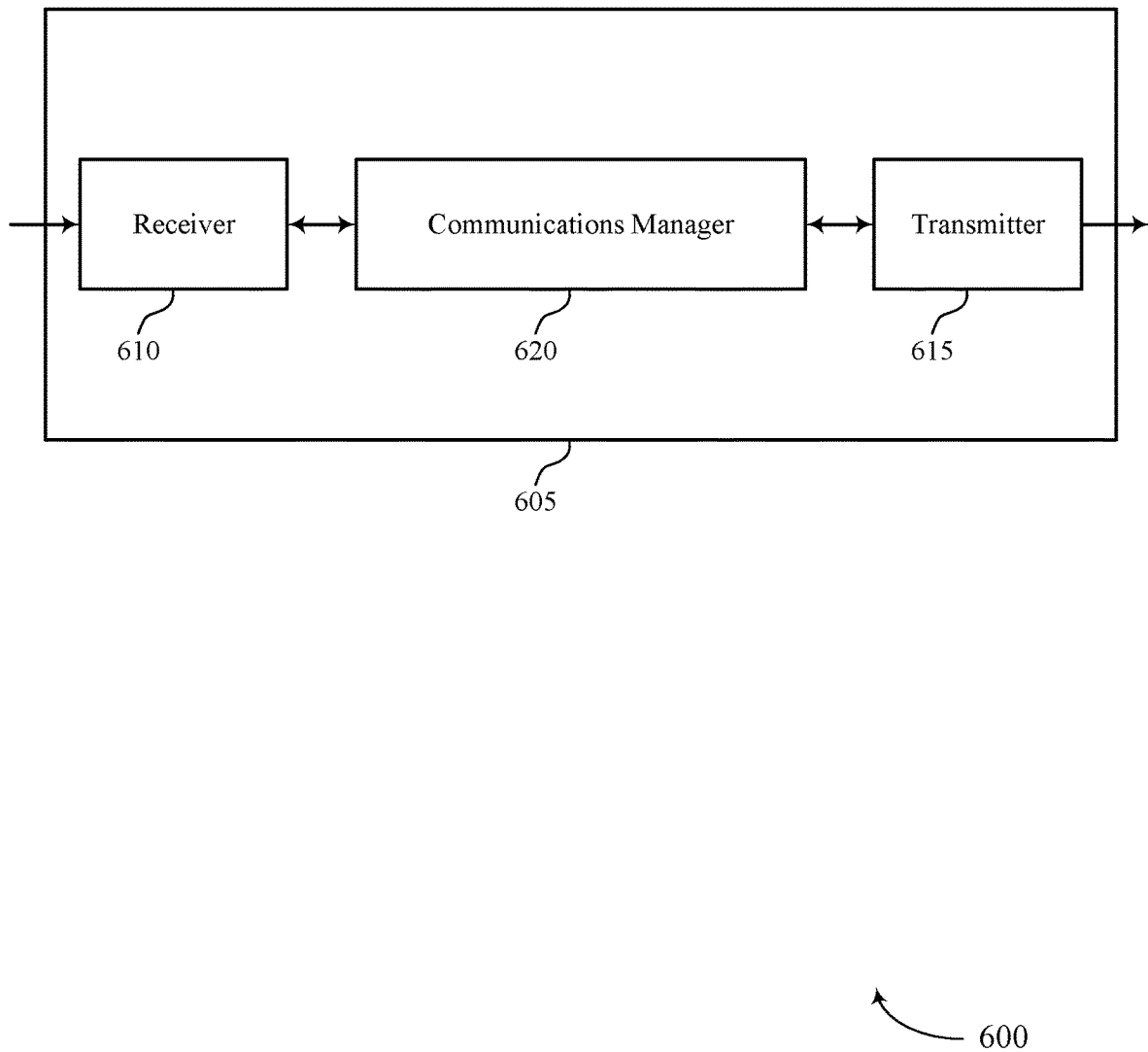
FIGS. 6 and 7 show block diagrams of devices that support techniques for encoding and decoding a channel between wireless communication devices in accordance with aspects of the present disclosure.

FIG. 6 shows a block diagram 600 of a device 605 that supports techniques for encoding and decoding a channel between wireless communication devices in accordance with aspects of the present disclosure. The device 605 may be an example of aspects of a UE 115 as described herein. The device 605 may include a receiver 610, a transmitter 615, and a communications manager 620. The device 605 may also include a processor. Each of these components may be in communication with one another (e.g., via one or more buses).

The receiver 610 may provide a means for receiving information such as packets, user data, control information, or any combination thereof associated with various information channels (e.g., control channels, data channels, information channels related to techniques for encoding and decoding a channel between wireless communication devices). Information may be passed on to other components of the device 605. The receiver 610 may utilize a single antenna or a set of multiple antennas.

The transmitter 615 may provide a means for transmitting signals generated by other components of the device 605. For example, the transmitter 615 may transmit information such as packets, user data, control information, or any combination thereof associated with various information channels (e.g., control channels, data channels, information channels related to techniques for encoding and decoding a channel between wireless communication devices). In some examples, the transmitter 615 may be co-located with a receiver 610 in a transceiver module. The transmitter 615 may utilize a single antenna or a set of multiple antennas.

The communications manager 620, the receiver 610, the transmitter 615, or various combinations thereof or various components thereof may be examples of means for performing various aspects of techniques for encoding and decoding a channel between wireless communication devices as described herein. For example, the communications manager 620, the receiver 610, the transmitter 615, or various combinations or components thereof may support a method for performing one or more of the functions described herein.

In some examples, the communications manager 620, the receiver 610, the transmitter 615, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 620, the receiver 610, the transmitter 615, or various combinations or components thereof may be implemented in code (e.g., as communications management software or firmware) executed by a processor. If implemented in code executed by a processor, the functions of the communications manager 620, the receiver 610, the transmitter 615, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions in the present disclosure).

In some examples, the communications manager 620 may be configured to perform various operations (e.g., receiving, monitoring, transmitting) using or otherwise in cooperation with the receiver 610, the transmitter 615, or both. For example, the communications manager 620 may receive information from the receiver 610, send information to the transmitter 615, or be integrated in combination with the receiver 610, the transmitter 615, or both to receive information, transmit information, or perform various other operations as described herein.

The communications manager 620 may support wireless communications at a UE in accordance with examples as disclosed herein. For example, the communications manager 620 may be configured as or otherwise support a means for encoding CSF information associated with the UE to compress the CSF information to a first encoding output associated with a first dimensional space. The communications manager 620 may be configured as or otherwise support a means for applying entropy coding to the first encoding output of the CSF information, where the entropy coding transforms the first encoding output to a second encoding output associated with a second dimensional space that is smaller than the first dimensional space of the first encoding output. The communications manager 620 may be configured as or otherwise support a means for transmitting a CSF message including the second encoding output.

By including or configuring the communications manager 620 in accordance with examples as described herein, the device 605 (e.g., a processor controlling or otherwise coupled to the receiver 610, the transmitter 615, the communications manager 620, or a combination thereof) may support techniques for more efficient utilization of communication resources.

Figure 7:
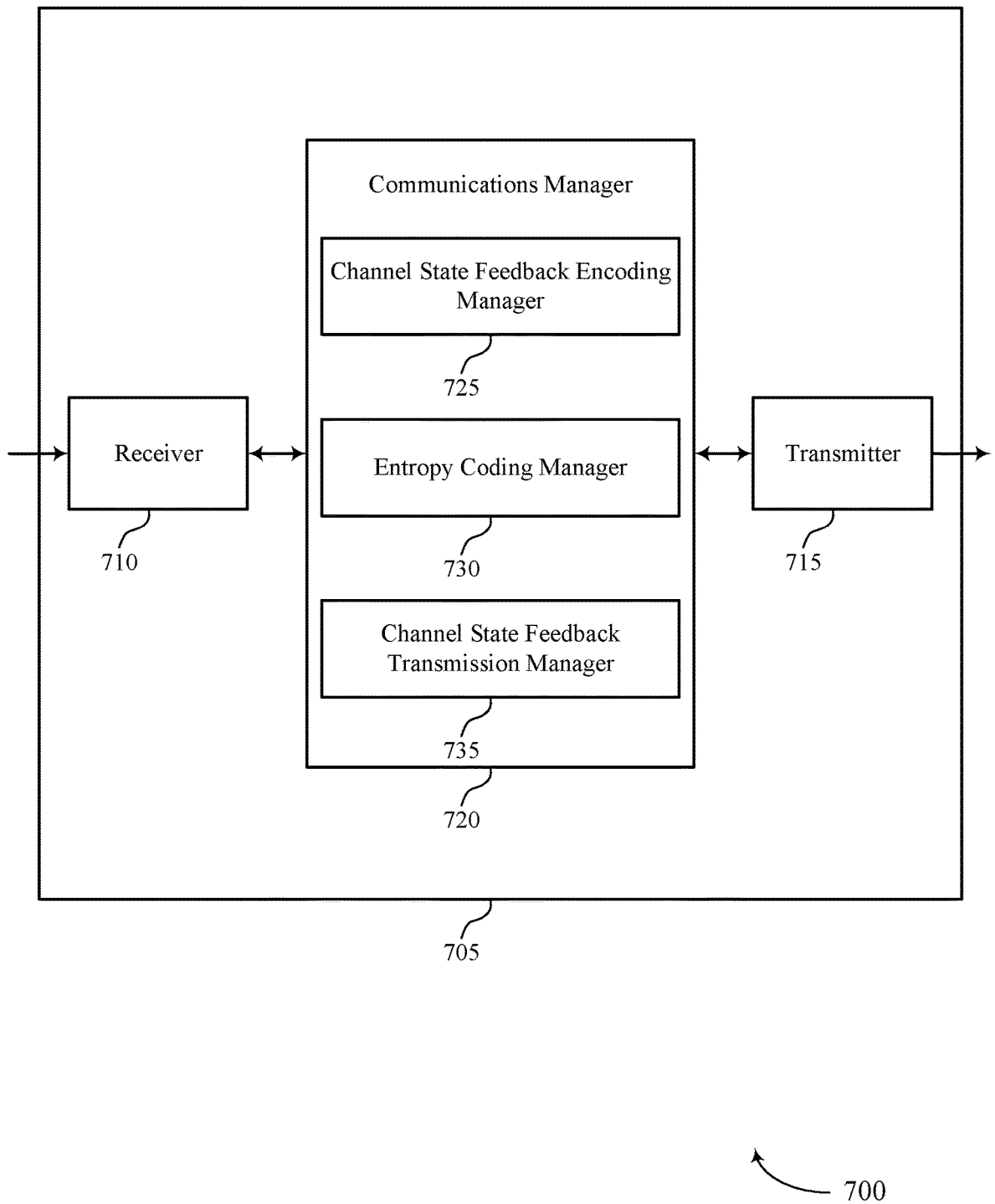

FIG. 7 shows a block diagram 700 of a device 705 that supports techniques for encoding and decoding a channel between wireless communication devices in accordance with aspects of the present disclosure. The device 705 may be an example of aspects of a device 605 or a UE 115 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to techniques for encoding and decoding a channel between wireless communication devices). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to techniques for encoding and decoding a channel between wireless communication devices). In some examples, the transmitter 715 may be co-located with a receiver 710 in a transceiver module. The transmitter 715 may utilize a single antenna or a set of multiple antennas.

The device 705, or various components thereof, may be an example of means for performing various aspects of techniques for encoding and decoding a channel between wireless communication devices as described herein. For example, the communications manager 720 may include a CSF encoding manager 725, an entropy coding manager 730, a CSF transmission manager 735, or any combination thereof. The communications manager 720 may be an example of aspects of a communications manager 620 as described herein. In some examples, the communications manager 720, or various components thereof, may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communications at a UE in accordance with examples as disclosed herein. The CSF encoding manager 725 may be configured as or otherwise support a means for encoding CSF information associated with the UE to compress the CSF information to a first encoding output associated with a first dimensional space. The entropy coding manager 730 may be configured as or otherwise support a means for applying entropy coding to the first encoding output of the CSF information, where the entropy coding transforms the first encoding output to a second encoding output associated with a second dimensional space that is smaller than the first dimensional space of the first encoding output. The CSF transmission manager 735 may be configured as or otherwise support a means for transmitting a CSF message including the second encoding output.

Figure 8:
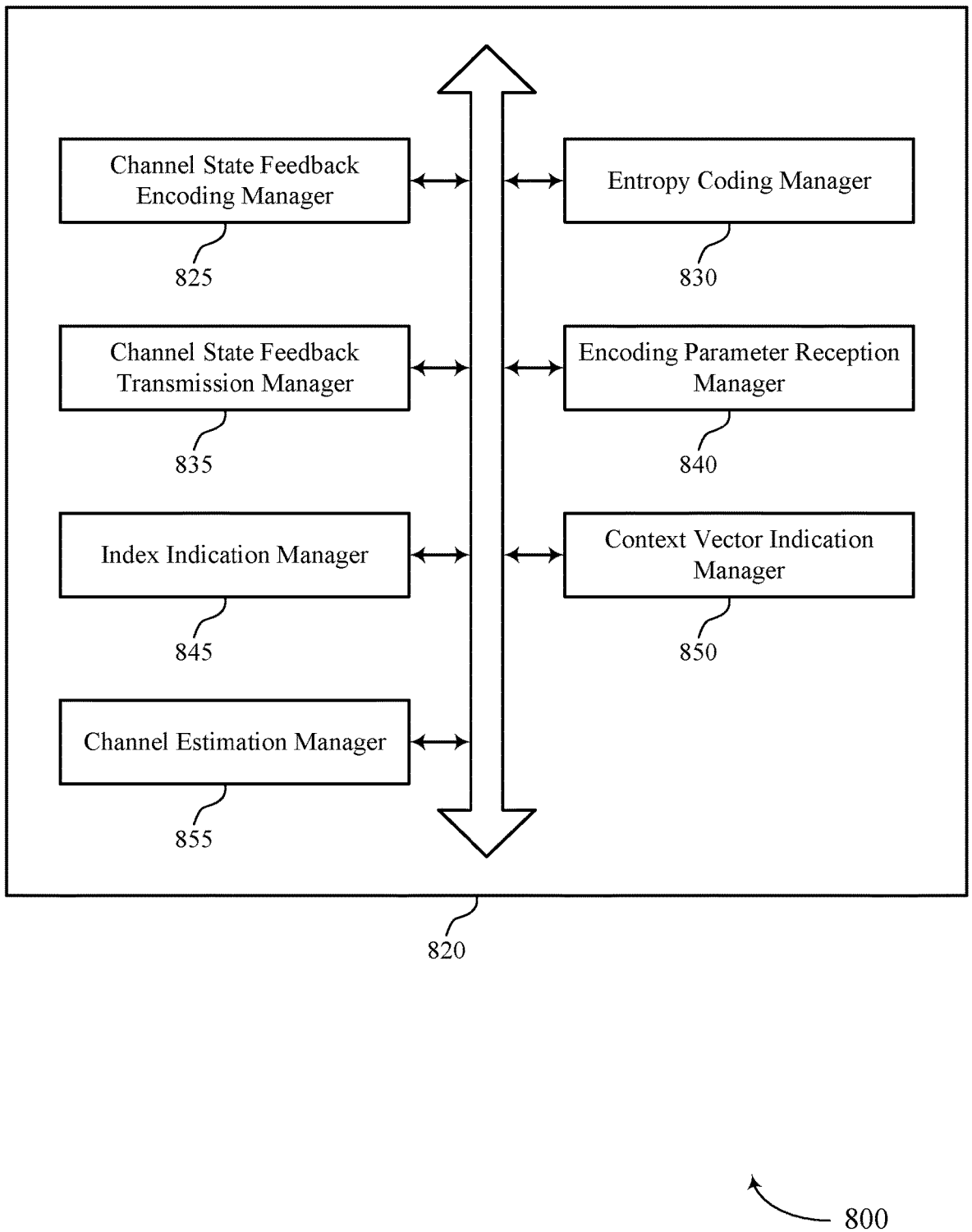
FIG. 8 shows a block diagram of a communications manager that supports techniques for encoding and decoding a channel between wireless communication devices in accordance with aspects of the present disclosure.

FIG. 8 shows a block diagram 800 of a communications manager 820 that supports techniques for encoding and decoding a channel between wireless communication devices in accordance with aspects of the present disclosure. The communications manager 820 may be an example of aspects of a communications manager 620, a communications manager 720, or both, as described herein. The communications manager 820, or various components thereof, may be an example of means for performing various aspects of techniques for encoding and decoding a channel between wireless communication devices as described herein. For example, the communications manager 820 may include a CSF encoding manager 825, an entropy coding manager 830, a CSF transmission manager 835, an encoding parameter reception manager 840, an index indication manager 845, a context vector indication manager 850, a channel estimation manager 855, or any combination thereof. Each of these components may communicate, directly or indirectly, with one another (e.g., via one or more buses).

The communications manager 820 may support wireless communications at a UE in accordance with examples as disclosed herein. The CSF encoding manager 825 may be configured as or otherwise support a means for encoding CSF information associated with the UE to compress the CSF information to a first encoding output associated with a first dimensional space. The entropy coding manager 830 may be configured as or otherwise support a means for applying entropy coding to the first encoding output of the CSF information, where the entropy coding transforms the first encoding output to a second encoding output associated with a second dimensional space that is smaller than the first dimensional space of the first encoding output. The CSF transmission manager 835 may be configured as or otherwise support a means for transmitting a CSF message including the second encoding output.

In some examples, the encoding parameter reception manager 840 may be configured as or otherwise support a means for receiving an indication of a size of the first dimensional space, where the UE encodes the CSF information based on the indication.

In some examples, the encoding parameter reception manager 840 may be configured as or otherwise support a means for receiving an indication of a size of the second dimensional space, where the UE applies the entropy coding to the first encoding output based on the indication.

In some examples, the entropy coding manager 830 may be configured as or otherwise support a means for receiving an indication of an entropy coding technique, where the UE applies the entropy coding to the first encoding output based on the indication.

In some examples, the entropy coding technique is a machine-learning based technique. In some examples, the machine-learning based technique includes training a set of one or more parameters with a dataset associated with the set of one or more parameters.

In some examples, the entropy coding technique is trained together with an encoder of the UE and a universal decoder of a network device.

In some examples, the entropy coding technique is trained separately from an encoder of the UE, a universal decoder of a network device, or both.

In some examples, the UE is configured with one or more encoders for encoding the CSF information, the one or more encoders each configured to be compatible with a universal decoder at a network device.

In some examples, each encoder of the one or more encoders is implemented by a neural network that utilizes machine-learning to compress the CSF information to the first encoding output.

In some examples, each of the one or more encoders is associated with a different channel model, or corresponds to a different set of antenna ports, or corresponds to a different set of antenna panels, or a combination thereof.

In some examples, the index indication manager 845 may be configured as or otherwise support a means for transmitting, to a network device, an indication of an index associated with the UE for the network device to use in decoding the CSF message.

In some examples, the context vector indication manager 850 may be configured as or otherwise support a means for transmitting, to a network device, an indication of a context vector for the network device to use in decoding the CSF message, the context vector associated with one or more parameters of the UE.

In some examples, each point of the first dimensional space, the second dimensional space, or a combination thereof, maps to the CSF information in a dimensional space larger than the first dimensional space.

In some examples, the channel estimation manager 855 may be configured as or otherwise support a means for estimating a channel between the UE and a network device, where the CSF information is based at least on part on estimating the channel.

Figure 9:
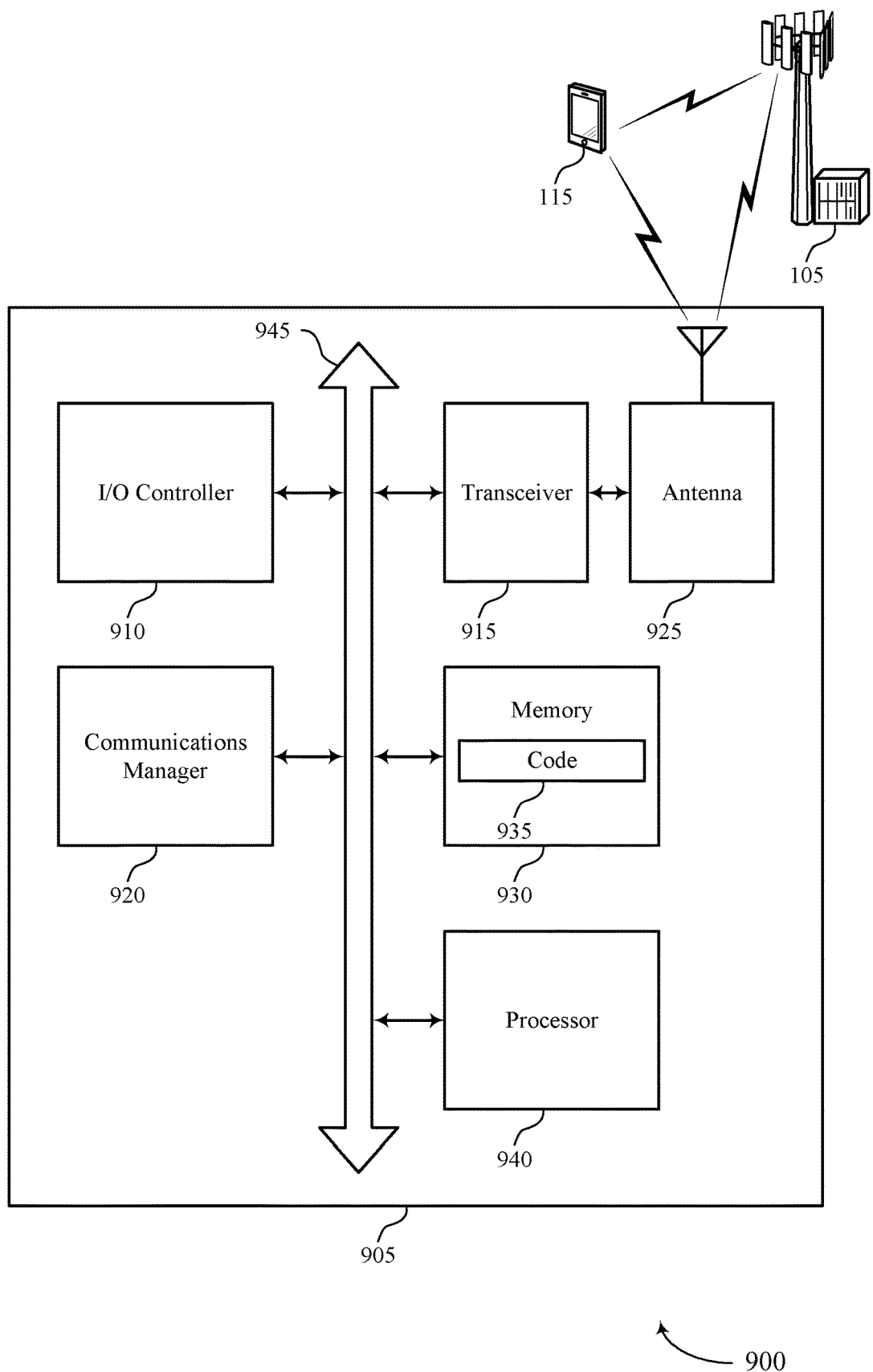
FIG. 9 shows a diagram of a system including a device that supports techniques for encoding and decoding a channel between wireless communication devices in accordance with aspects of the present disclosure.

FIG. 9 shows a diagram of a system 900 including a device 905 that supports techniques for encoding and decoding a channel between wireless communication devices in accordance with aspects of the present disclosure. The device 905 may be an example of or include the components of a device 605, a device 705, or a UE 115 as described herein. The device 905 may communicate wirelessly with one or more network devices 105, UEs 115, or any combination thereof. The device 905 may include components for bi-directional voice and data communications including components for transmitting and receiving communications, such as a communications manager 920, an input/output (I/O) controller 910, a transceiver 915, an antenna 925, a memory 930, code 935, and a processor 940. These components may be in electronic communication or otherwise coupled (e.g., operatively, communicatively, functionally, electronically, electrically) via one or more buses (e.g., a bus 945).

The I/O controller 910 may manage input and output signals for the device 905. The I/O controller 910 may also manage peripherals not integrated into the device 905. In some cases, the I/O controller 910 may represent a physical connection or port to an external peripheral. In some cases, the I/O controller 910 may utilize an operating system such as iOS®, ANDROID®, MS-DOS®, MS-WINDOWS®, OS/2®, UNIX®, LINUX®, or another known operating system. Additionally, or alternatively, the I/O controller 910 may represent or interact with a modem, a keyboard, a mouse, a touchscreen, or a similar device. In some cases, the I/O controller 910 may be implemented as part of a processor, such as the processor 940. In some cases, a user may interact with the device 905 via the I/O controller 910 or via hardware components controlled by the I/O controller 910.

In some cases, the device 905 may include a single antenna 925. However, in some other cases, the device 905 may have more than one antenna 925, which may be capable of concurrently transmitting or receiving multiple wireless transmissions. The transceiver 915 may communicate bi-directionally, via the one or more antennas 925, wired, or wireless links as described herein. For example, the transceiver 915 may represent a wireless transceiver and may communicate bi-directionally with another wireless transceiver. The transceiver 915 may also include a modem to modulate the packets, to provide the modulated packets to one or more antennas 925 for transmission, and to demodulate packets received from the one or more antennas 925. The transceiver 915, or the transceiver 915 and one or more antennas 925, may be an example of a transmitter 615, a transmitter 715, a receiver 610, a receiver 710, or any combination thereof or component thereof, as described herein.

The memory 930 may include random access memory (RAM) and read-only memory (ROM). The memory 930 may store computer-readable, computer-executable code 935 including instructions that, when executed by the processor 940, cause the device 905 to perform various functions described herein. The code 935 may be stored in a non-transitory computer-readable medium such as system memory or another type of memory. In some cases, the code 935 may not be directly executable by the processor 940 but may cause a computer (e.g., when compiled and executed) to perform functions described herein. In some cases, the memory 930 may contain, among other things, a basic I/O system (BIOS) which may control basic hardware or software operation such as the interaction with peripheral components or devices.

The processor 940 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In some other cases, a memory controller may be integrated into the processor 940. The processor 940 may be configured to execute computer-readable instructions stored in a memory (e.g., the memory 930) to cause the device 905 to perform various functions (e.g., functions or tasks supporting techniques for encoding and decoding a channel between wireless communication devices). For example, the device 905 or a component of the device 905 may include a processor 940 and memory 930 coupled with or to the processor 940, the processor 940 and memory 930 configured to perform various functions described herein.

The communications manager 920 may support wireless communications at a UE in accordance with examples as disclosed herein. For example, the communications manager 920 may be configured as or otherwise support a means for encoding CSF information associated with the UE to compress the CSF information to a first encoding output associated with a first dimensional space. The communications manager 920 may be configured as or otherwise support a means for applying entropy coding to the first encoding output of the CSF information, where the entropy coding transforms the first encoding output to a second encoding output associated with a second dimensional space that is smaller than the first dimensional space of the first encoding output. The communications manager 920 may be configured as or otherwise support a means for transmitting a CSF message including the second encoding output.

By including or configuring the communications manager 920 in accordance with examples as described herein, the device 905 may support techniques for more efficient utilization of communication resources.

In some examples, the communications manager 920 may be configured to perform various operations (e.g., receiving, monitoring, transmitting) using or otherwise in cooperation with the transceiver 915, the one or more antennas 925, or any combination thereof. Although the communications manager 920 is illustrated as a separate component, in some examples, one or more functions described with reference to the communications manager 920 may be supported by or performed by the processor 940, the memory 930, the code 935, or any combination thereof. For example, the code 935 may include instructions executable by the processor 940 to cause the device 905 to perform various aspects of techniques for encoding and decoding a channel between wireless communication devices as described herein, or the processor 940 and the memory 930 may be otherwise configured to perform or support such operations.

Figure 10:
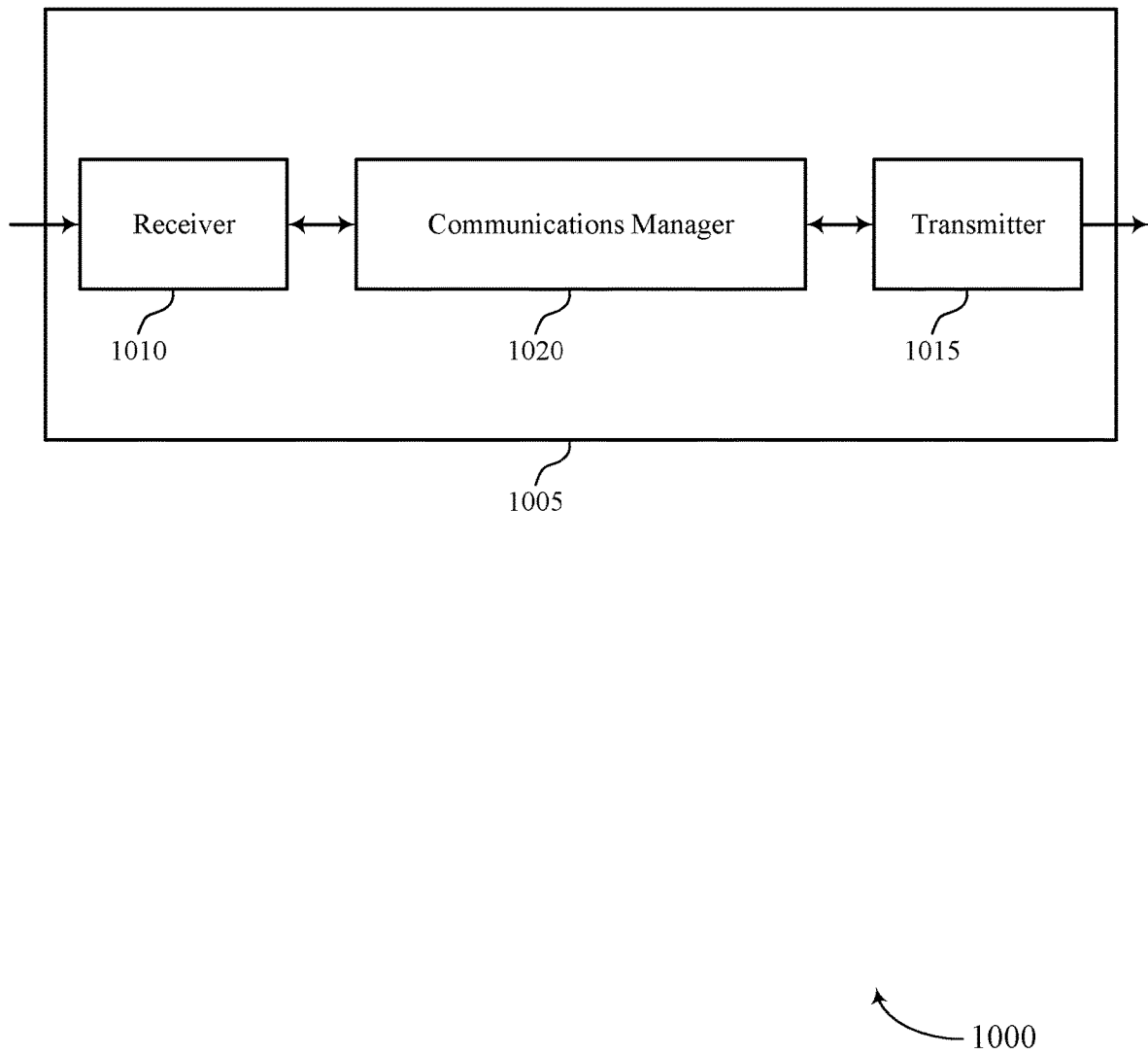
FIGS. 10 and 11 show block diagrams of devices that support techniques for encoding and decoding a channel between wireless communication devices in accordance with aspects of the present disclosure.

FIG. 10 shows a block diagram 1000 of a device 1005 that supports techniques for encoding and decoding a channel between wireless communication devices in accordance with aspects of the present disclosure. The device 1005 may be an example of aspects of a network device as described herein. The device 1005 may include a receiver 1010, a transmitter 1015, and a communications manager 1020. The device 1005 may also include a processor. Each of these components may be in communication with one another (e.g., via one or more buses).

The receiver 1010 may provide a means for receiving information such as packets, user data, control information, or any combination thereof associated with various information channels (e.g., control channels, data channels, information channels related to techniques for encoding and decoding a channel between wireless communication devices). Information may be passed on to other components of the device 1005. The receiver 1010 may utilize a single antenna or a set of multiple antennas.

The transmitter 1015 may provide a means for transmitting signals generated by other components of the device 1005. For example, the transmitter 1015 may transmit information such as packets, user data, control information, or any combination thereof associated with various information channels (e.g., control channels, data channels, information channels related to techniques for encoding and decoding a channel between wireless communication devices). In some examples, the transmitter 1015 may be co-located with a receiver 1010 in a transceiver module. The transmitter 1015 may utilize a single antenna or a set of multiple antennas.

The communications manager 1020, the receiver 1010, the transmitter 1015, or various combinations thereof or various components thereof may be examples of means for performing various aspects of techniques for encoding and decoding a channel between wireless communication devices as described herein. For example, the communications manager 1020, the receiver 1010, the transmitter 1015, or various combinations or components thereof may support a method for performing one or more of the functions described herein.

In some examples, the communications manager 1020, the receiver 1010, the transmitter 1015, or various combinations or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 1020, the receiver 1010, the transmitter 1015, or various combinations or components thereof may be implemented in code (e.g., as communications management software or firmware) executed by a processor. If implemented in code executed by a processor, the functions of the communications manager 1020, the receiver 1010, the transmitter 1015, or various combinations or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

In some examples, the communications manager 1020 may be configured to perform various operations (e.g., receiving, monitoring, transmitting) using or otherwise in cooperation with the receiver 1010, the transmitter 1015, or both. For example, the communications manager 1020 may receive information from the receiver 1010, send information to the transmitter 1015, or be integrated in combination with the receiver 1010, the transmitter 1015, or both to receive information, transmit information, or perform various other operations as described herein.

The communications manager 1020 may support wireless communications at a network device in accordance with examples as disclosed herein. For example, the communications manager 1020 may be configured as or otherwise support a means for receiving a CSF message including compressed CSF information associated with a first dimensional space. The communications manager 1020 may be configured as or otherwise support a means for applying entropy decoding to the compressed CSF information to partially decompress the compressed CSF information to a first decoding output associated with a second dimensional space, where the second dimensional space is larger than the first dimensional space. The communications manager 1020 may be configured as or otherwise support a means for decoding the first decoding output to completely decompress the compressed CSF information to a second decoding output associated with a third dimensional space, the third dimensional space larger than the second dimensional space of the first decoding output.

By including or configuring the communications manager 1020 in accordance with examples as described herein, the device 1005 (e.g., a processor controlling or otherwise coupled to the receiver 1010, the transmitter 1015, the communications manager 1020, or a combination thereof) may support techniques for more efficient utilization of communication resources.

Figure 11:
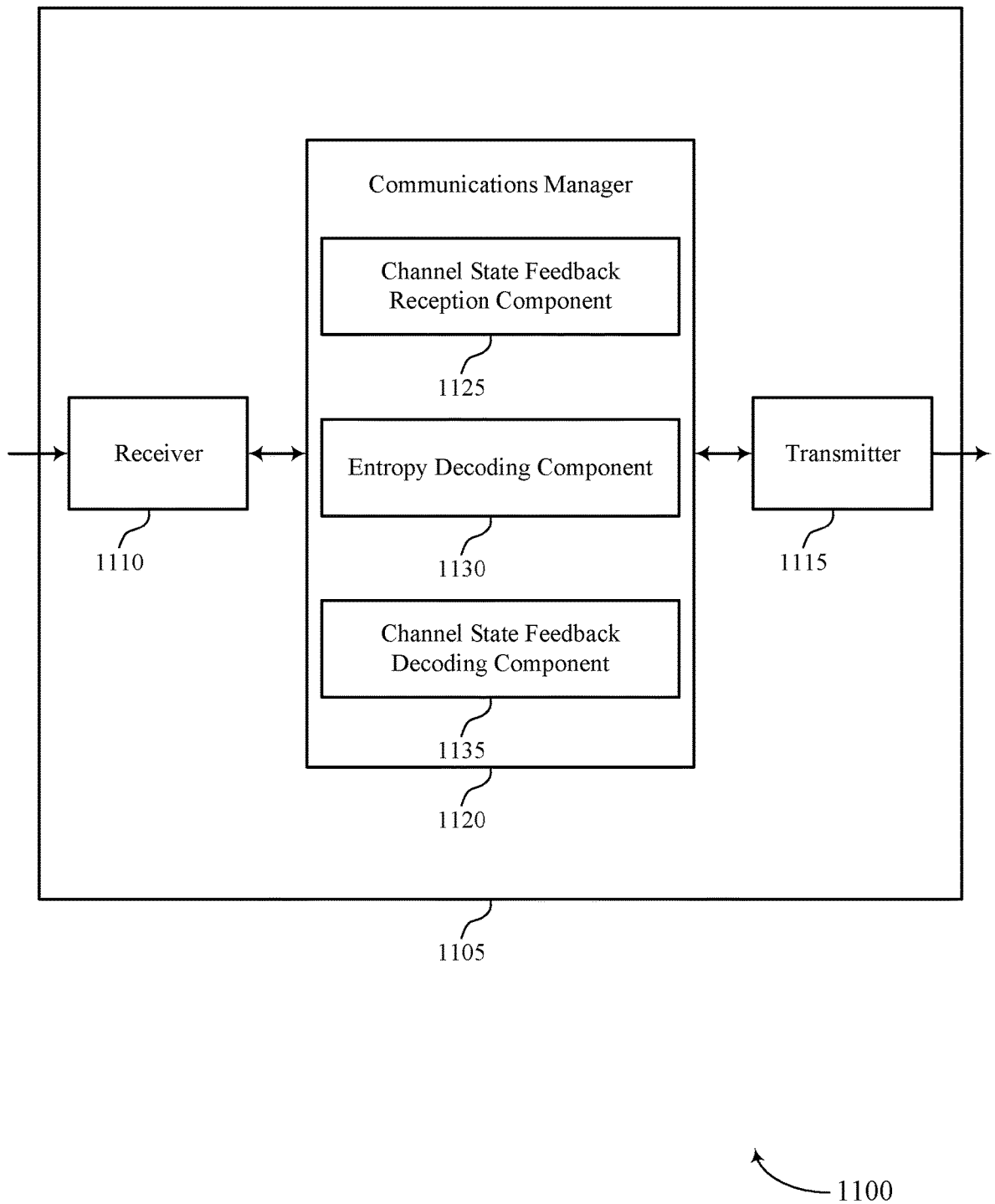

FIG. 11 shows a block diagram 1100 of a device 1105 that supports techniques for encoding and decoding a channel between wireless communication devices in accordance with aspects of the present disclosure. The device 1105 may be an example of aspects of a device 1005 or a network device 105 or 115 as described herein. The device 1105 may include a receiver 1110, a transmitter 1115, and a communications manager 1120. The device 1105 may also include a processor. Each of these components may be in communication with one another (e.g., via one or more buses).

The receiver 1110 may provide a means for receiving information such as packets, user data, control information, or any combination thereof associated with various information channels (e.g., control channels, data channels, information channels related to techniques for encoding and decoding a channel between wireless communication devices). Information may be passed on to other components of the device 1105. The receiver 1110 may utilize a single antenna or a set of multiple antennas.

The transmitter 1115 may provide a means for transmitting signals generated by other components of the device 1105. For example, the transmitter 1115 may transmit information such as packets, user data, control information, or any combination thereof associated with various information channels (e.g., control channels, data channels, information channels related to techniques for encoding and decoding a channel between wireless communication devices). In some examples, the transmitter 1115 may be co-located with a receiver 1110 in a transceiver module. The transmitter 1115 may utilize a single antenna or a set of multiple antennas.

The device 1105, or various components thereof, may be an example of means for performing various aspects of techniques for encoding and decoding a channel between wireless communication devices as described herein. For example, the communications manager 1120 may include a CSF reception component 1125, an entropy decoding component 1130, a CSF decoding component 1135, or any combination thereof. The communications manager 1120 may be an example of aspects of a communications manager 1020 as described herein. In some examples, the communications manager 1120, or various components thereof, may be configured to perform various operations (e.g., receiving, monitoring, transmitting) using or otherwise in cooperation with the receiver 1110, the transmitter 1115, or both. For example, the communications manager 1120 may receive information from the receiver 1110, send information to the transmitter 1115, or be integrated in combination with the receiver 1110, the transmitter 1115, or both to receive information, transmit information, or perform various other operations as described herein.

The communications manager 1120 may support wireless communications at a network device in accordance with examples as disclosed herein. The CSF reception component 1125 may be configured as or otherwise support a means for receiving a CSF message including compressed CSF information associated with a first dimensional space. The entropy decoding component 1130 may be configured as or otherwise support a means for applying entropy decoding to the compressed CSF information to partially decompress the compressed CSF information to a first decoding output associated with a second dimensional space, where the second dimensional space is larger than the first dimensional space. The CSF decoding component 1135 may be configured as or otherwise support a means for decoding the first decoding output to completely decompress the compressed CSF information to a second decoding output associated with a third dimensional space, the third dimensional space larger than the second dimensional space of the first decoding output.

Figure 12:
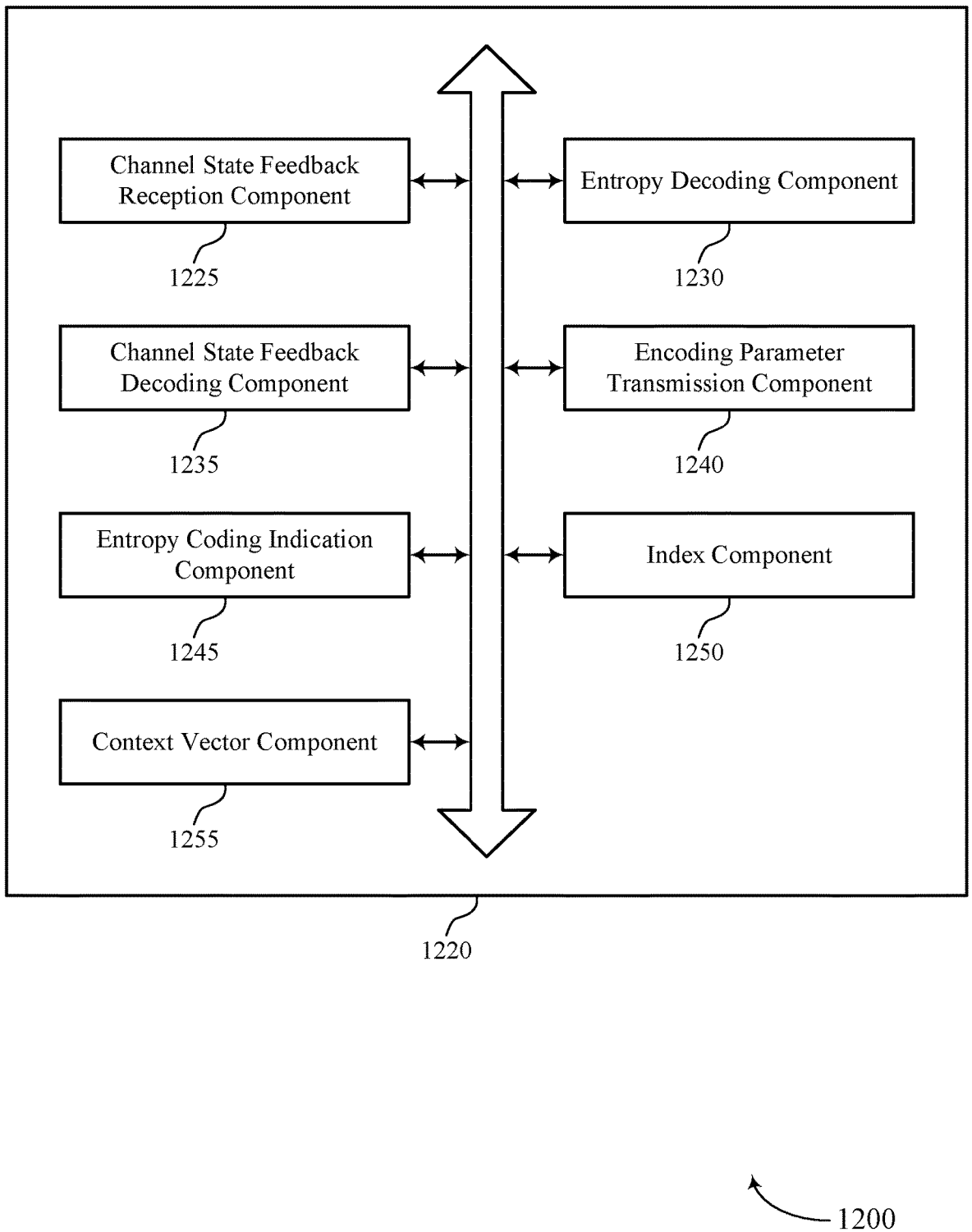
FIG. 12 shows a block diagram of a communications manager that supports techniques for encoding and decoding a channel between wireless communication devices in accordance with aspects of the present disclosure.

FIG. 12 shows a block diagram 1200 of a communications manager 1220 that supports techniques for encoding and decoding a channel between wireless communication devices in accordance with aspects of the present disclosure. The communications manager 1220 may be an example of aspects of a communications manager 1020, a communications manager 1120, or both, as described herein. The communications manager 1220, or various components thereof, may be an example of means for performing various aspects of techniques for encoding and decoding a channel between wireless communication devices as described herein. For example, the communications manager 1220 may include a CSF reception component 1225, an entropy decoding component 1230, a CSF decoding component 1235, an encoding parameter transmission component 1240, an entropy coding indication component 1245, an index component 1250, a context vector component 1255, or any combination thereof. Each of these components may communicate, directly or indirectly, with one another (e.g., via one or more buses).

The communications manager 1220 may support wireless communications at a network device in accordance with examples as disclosed herein. The CSF reception component 1225 may be configured as or otherwise support a means for receiving a CSF message including compressed CSF information associated with a first dimensional space. The entropy decoding component 1230 may be configured as or otherwise support a means for applying entropy decoding to the compressed CSF information to partially decompress the compressed CSF information to a first decoding output associated with a second dimensional space, where the second dimensional space is larger than the first dimensional space. The CSF decoding component 1235 may be configured as or otherwise support a means for decoding the first decoding output to completely decompress the compressed CSF information to a second decoding output associated with a third dimensional space, the third dimensional space larger than the second dimensional space of the first decoding output.

In some examples, the encoding parameter transmission component 1240 may be configured as or otherwise support a means for transmitting an indication of a dimensional size of an output of an encoder of a UE.

In some examples, the encoding parameter transmission component 1240 may be configured as or otherwise support a means for transmitting an indication of a dimensional size of an output of an entropy coding procedure to be performed by a UE, where the first dimensional space of the compressed CSF information received by the network device is based on the dimensional size.

In some examples, the entropy coding indication component 1245 may be configured as or otherwise support a means for transmitting an indication of an entropy coding technique for a UE to apply to an output of an encoder of the UE.

In some examples, the entropy coding technique is a machine-learning based technique. In some examples, the machine-learning based technique includes training a set of one or more parameters with a dataset associated with the set of one or more parameters.

In some examples, the entropy coding technique is trained together with the encoder of the UE and a universal decoder of the network device.

In some examples, the entropy coding technique is trained separately from the encoder of the UE, a universal decoder of the network device, or both.

In some examples, the network device is configured with a universal decoder for decoding CSF information output from different encoders, the universal decoder compatible with each of the different encoders.

In some examples, the universal decoder is trained based on one or more defined inputs and one or more defined outputs for the universal decoder.

In some examples, the universal decoder is configured based on one or more parameters defined for the universal decoder.

In some examples, the universal decoder is implemented by a neural network that utilizes machine-learning to decompress the compressed CSF information to the second decoding output.

In some examples, to support decoding the first decoding output, the CSF decoding component 1235 may be configured as or otherwise support a means for decoding the first decoding output by concatenating the first decoding output with an index associated with a UE.

In some examples, the index component 1250 may be configured as or otherwise support a means for receiving an indication of the index associated with the UE for the network device to use in decoding the first decoding output.

In some examples, the index component 1250 may be configured as or otherwise support a means for identifying the index associated with the UE for the network device to use in decoding the first decoding output, where identifying the index is based on a set of one or more resources over which the CSF message is received by the network device.

In some examples, to support decoding the first decoding output, the CSF decoding component 1235 may be configured as or otherwise support a means for decoding the first decoding output by concatenating the first decoding output with a context vector, the context vector associated with one or more parameters of a UE.

In some examples, the context vector component 1255 may be configured as or otherwise support a means for receiving an indication of the context vector for the network device to use in decoding the CSF message.

In some examples, each point of the first dimensional space, the second dimensional space, or a combination thereof maps to the second decoding output of the third dimensional space.

Figure 13:
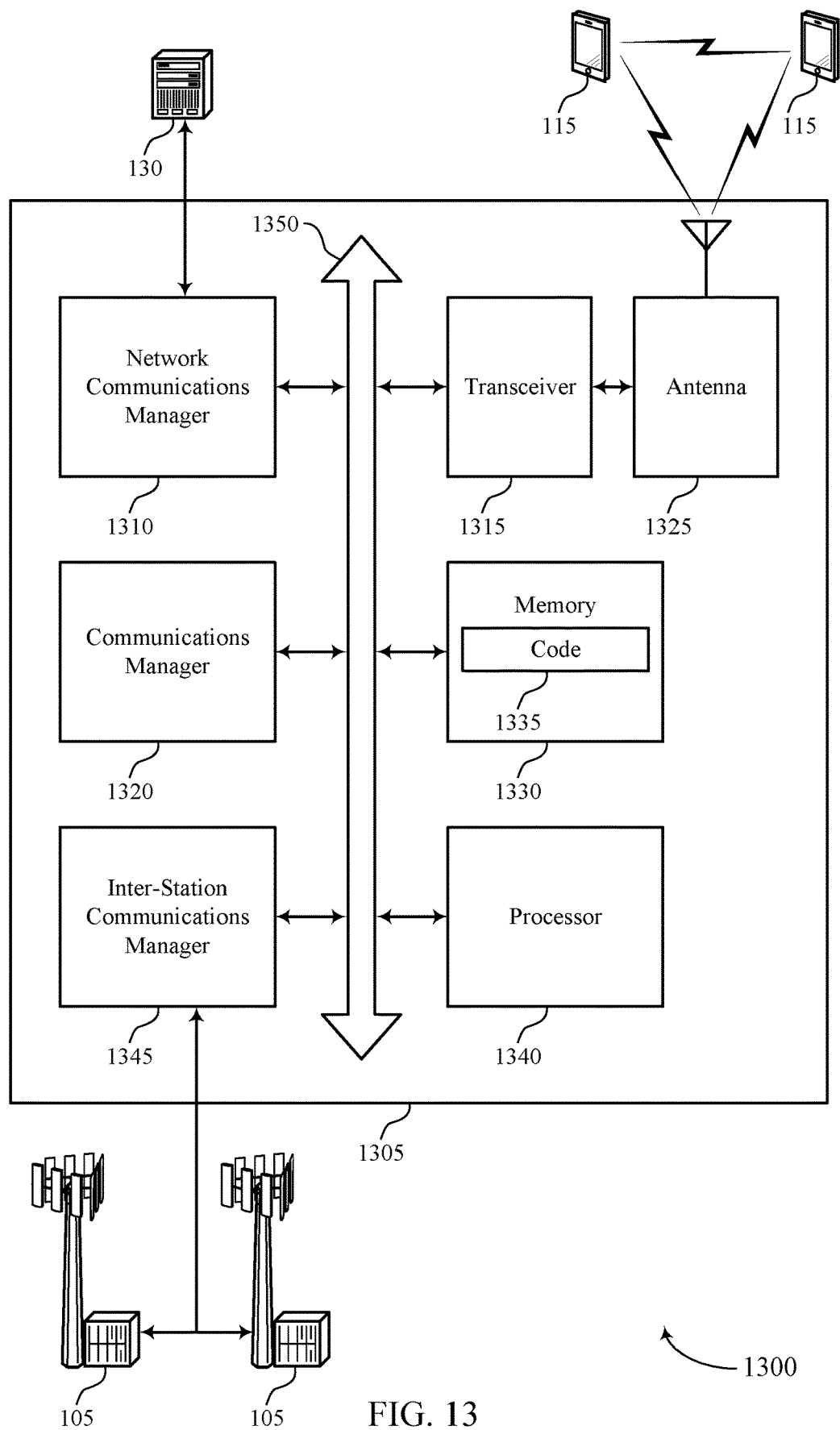
FIG. 13 shows a diagram of a system including a device that supports techniques for encoding and decoding a channel between wireless communication devices in accordance with aspects of the present disclosure.

FIG. 13 shows a diagram of a system 1300 including a device 1305 that supports techniques for encoding and decoding a channel between wireless communication devices in accordance with aspects of the present disclosure. The device 1305 may be an example of or include the components of a device 1005, a device 1105, or a network device as described herein. The device 1305 may include components for bi-directional voice and data communications including components for transmitting and receiving communications, such as a communications manager 1320, a network communications manager 1310, a transceiver 1315, an antenna 1325, a memory 1330, code 1335, a processor 1340, and an inter-station communications manager 1345. These components may be in electronic communication or otherwise coupled (e.g., operatively, communicatively, functionally, electronically, electrically) via one or more buses (e.g., a bus 1350).

The network communications manager 1310 may manage communications with a core network 130 (e.g., via one or more wired backhaul links). For example, the network communications manager 1310 may manage the transfer of data communications for client devices, such as one or more UEs 115.

In some cases, the device 1305 may include a single antenna 1325. However, in some other cases the device 1305 may have more than one antenna 1325, which may be capable of concurrently transmitting or receiving multiple wireless transmissions. The transceiver 1315 may communicate bi-directionally, via the one or more antennas 1325, wired, or wireless links as described herein. For example, the transceiver 1315 may represent a wireless transceiver and may communicate bi-directionally with another wireless transceiver. The transceiver 1315 may also include a modem to modulate the packets, to provide the modulated packets to one or more antennas 1325 for transmission, and to demodulate packets received from the one or more antennas 1325. The transceiver 1315, or the transceiver 1315 and one or more antennas 1325, may be an example of a transmitter 1015, a transmitter 1115, a receiver 1010, a receiver 1110, or any combination thereof or component thereof, as described herein.

The memory 1330 may include RAM and ROM. The memory 1330 may store computer-readable, computer-executable code 1335 including instructions that, when executed by the processor 1340, cause the device 1305 to perform various functions described herein. The code 1335 may be stored in a non-transitory computer-readable medium such as system memory or another type of memory. In some cases, the code 1335 may not be directly executable by the processor 1340 but may cause a computer (e.g., when compiled and executed) to perform functions described herein. In some cases, the memory 1330 may contain, among other things, a BIOS which may control basic hardware or software operation such as the interaction with peripheral components or devices.

The processor 1340 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In some other cases, a memory controller may be integrated into the processor 1340. The processor 1340 may be configured to execute computer-readable instructions stored in a memory (e.g., the memory 1330) to cause the device 1305 to perform various functions (e.g., functions or tasks supporting techniques for encoding and decoding a channel between wireless communication devices). For example, the device 1305 or a component of the device 1305 may include a processor 1340 and memory 1330 coupled to the processor 1340, the processor 1340 and memory 1330 configured to perform various functions described herein.

The inter-station communications manager 1345 may manage communications with other network devices 105, and may include a controller or scheduler for controlling communications with UEs 115 in cooperation with other network devices 105. For example, the inter-station communications manager 1345 may coordinate scheduling for transmissions to UEs 115 for various interference mitigation techniques such as beamforming or joint transmission. In some examples, the inter-station communications manager 1345 may provide an X2 interface within an LTE/LTE-A wireless communications network technology to provide communication between network devices 105.

The communications manager 1320 may support wireless communications at a network device in accordance with examples as disclosed herein. For example, the communications manager 1320 may be configured as or otherwise support a means for receiving a CSF message including compressed CSF information associated with a first dimensional space. The communications manager 1320 may be configured as or otherwise support a means for applying entropy decoding to the compressed CSF information to partially decompress the compressed CSF information to a first decoding output associated with a second dimensional space, where the second dimensional space is larger than the first dimensional space. The communications manager 1320 may be configured as or otherwise support a means for decoding the first decoding output to completely decompress the compressed CSF information to a second decoding output associated with a third dimensional space, the third dimensional space larger than the second dimensional space of the first decoding output.

By including or configuring the communications manager 1320 in accordance with examples as described herein, the device 1305 may support techniques for more efficient utilization of communication resources.

In some examples, the communications manager 1320 may be configured to perform various operations (e.g., receiving, monitoring, transmitting) using or otherwise in cooperation with the transceiver 1315, the one or more antennas 1325, or any combination thereof. Although the communications manager 1320 is illustrated as a separate component, in some examples, one or more functions described with reference to the communications manager 1320 may be supported by or performed by the processor 1340, the memory 1330, the code 1335, or any combination thereof. For example, the code 1335 may include instructions executable by the processor 1340 to cause the device 1305 to perform various aspects of techniques for encoding and decoding a channel between wireless communication devices as described herein, or the processor 1340 and the memory 1330 may be otherwise configured to perform or support such operations.

Figure 14:
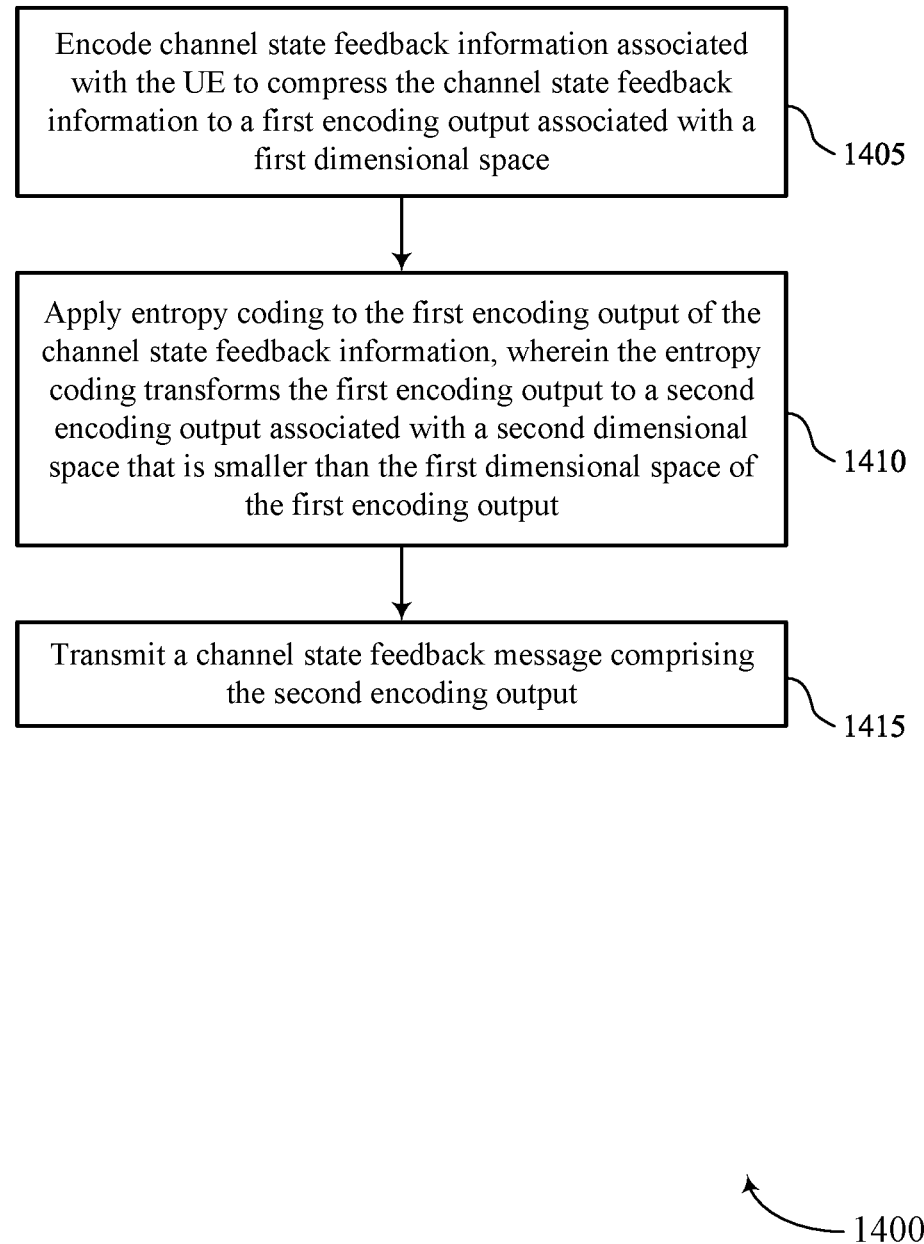
FIGS. 14 through 17 show flowcharts illustrating methods that support techniques for encoding and decoding a channel between wireless communication devices in accordance with aspects of the present disclosure.

FIG. 14 shows a flowchart illustrating a method 1400 that supports techniques for encoding and decoding a channel between wireless communication devices in accordance with aspects of the present disclosure. The operations of the method 1400 may be implemented by a UE or its components as described herein. For example, the operations of the method 1400 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1405, the method may include encoding CSF information associated with the UE to compress the CSF information to a first encoding output associated with a first dimensional space. The operations of 1405 may be performed in accordance with examples as disclosed herein. In some examples, aspects of the operations of 1405 may be performed by a CSF encoding manager 825 as described with reference to FIG. 8.

At 1410, the method may include applying entropy coding to the first encoding output of the CSF information, where the entropy coding transforms the first encoding output to a second encoding output associated with a second dimensional space that is smaller than the first dimensional space of the first encoding output. The operations of 1410 may be performed in accordance with examples as disclosed herein. In some examples, aspects of the operations of 1410 may be performed by an entropy coding manager 830 as described with reference to FIG. 8.

At 1415, the method may include transmitting a CSF message including the second encoding output. The operations of 1415 may be performed in accordance with examples as disclosed herein. In some examples, aspects of the operations of 1415 may be performed by a CSF transmission manager 835 as described with reference to FIG. 8.

Figure 15:
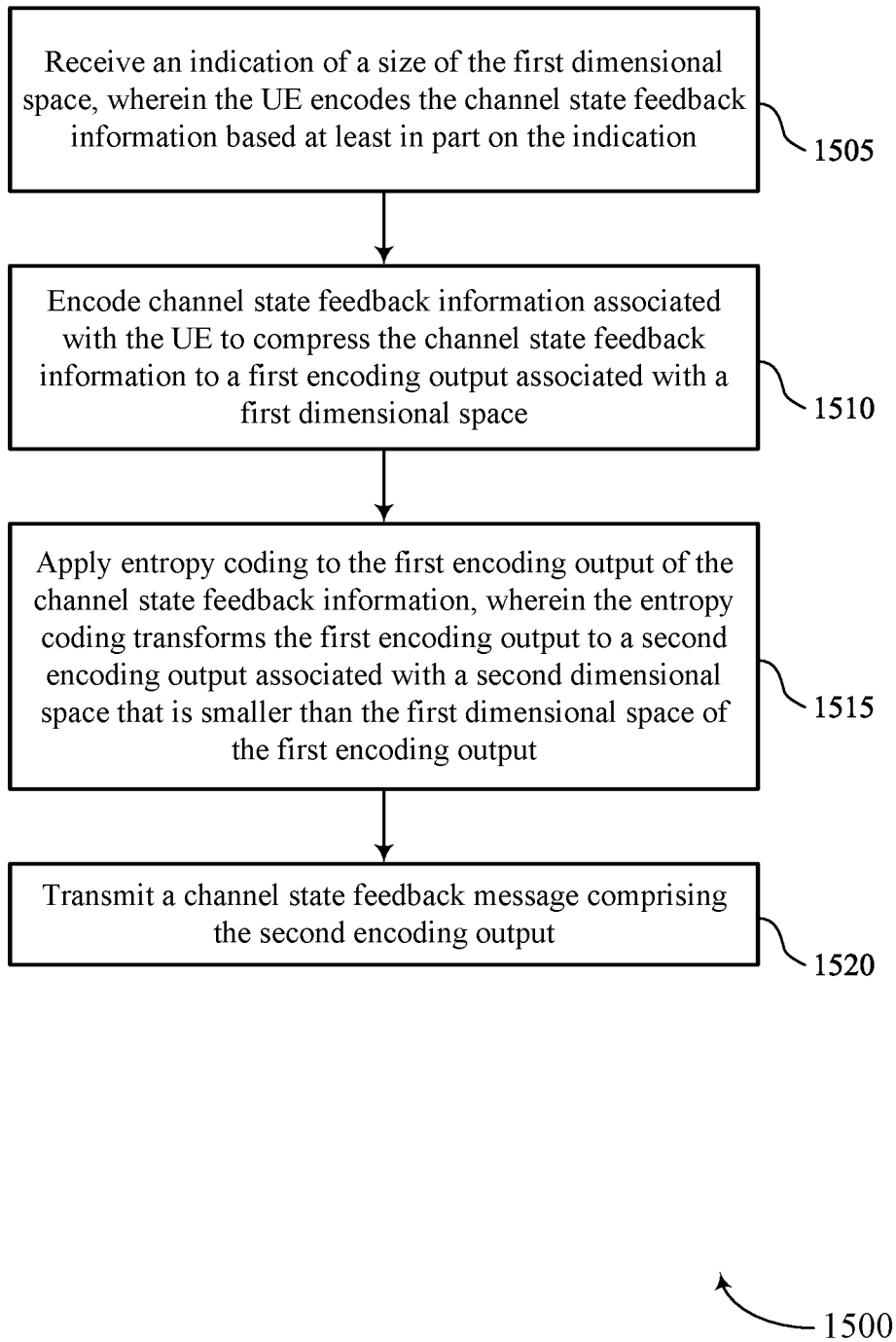

FIG. 15 shows a flowchart illustrating a method 1500 that supports techniques for encoding and decoding a channel between wireless communication devices in accordance with aspects of the present disclosure. The operations of the method 1500 may be implemented by a UE or its components as described herein. For example, the operations of the method 1500 may be performed by a UE 115 as described with reference to FIGS. 1 through 9. In some examples, a UE may execute a set of instructions to control the functional elements of the UE to perform the described functions. Additionally, or alternatively, the UE may perform aspects of the described functions using special-purpose hardware.

At 1505, the method may include receiving an indication of a size of the first dimensional space, where the UE encodes the CSF information based on the indication. The operations of 1505 may be performed in accordance with examples as disclosed herein. In some examples, aspects of the operations of 1505 may be performed by an encoding parameter reception manager 840 as described with reference to FIG. 8.

At 1510, the method may include encoding CSF information associated with the UE to compress the CSF information to a first encoding output associated with a first dimensional space. The operations of 1510 may be performed in accordance with examples as disclosed herein. In some examples, aspects of the operations of 1510 may be performed by a CSF encoding manager 825 as described with reference to FIG. 8.

At 1515, the method may include applying entropy coding to the first encoding output of the CSF information, where the entropy coding transforms the first encoding output to a second encoding output associated with a second dimensional space that is smaller than the first dimensional space of the first encoding output. The operations of 1515 may be performed in accordance with examples as disclosed herein. In some examples, aspects of the operations of 1515 may be performed by an entropy coding manager 830 as described with reference to FIG. 8.

At 1520, the method may include transmitting a CSF message including the second encoding output. The operations of 1520 may be performed in accordance with examples as disclosed herein. In some examples, aspects of the operations of 1520 may be performed by a CSF transmission manager 835 as described with reference to FIG. 8.

Figure 16:
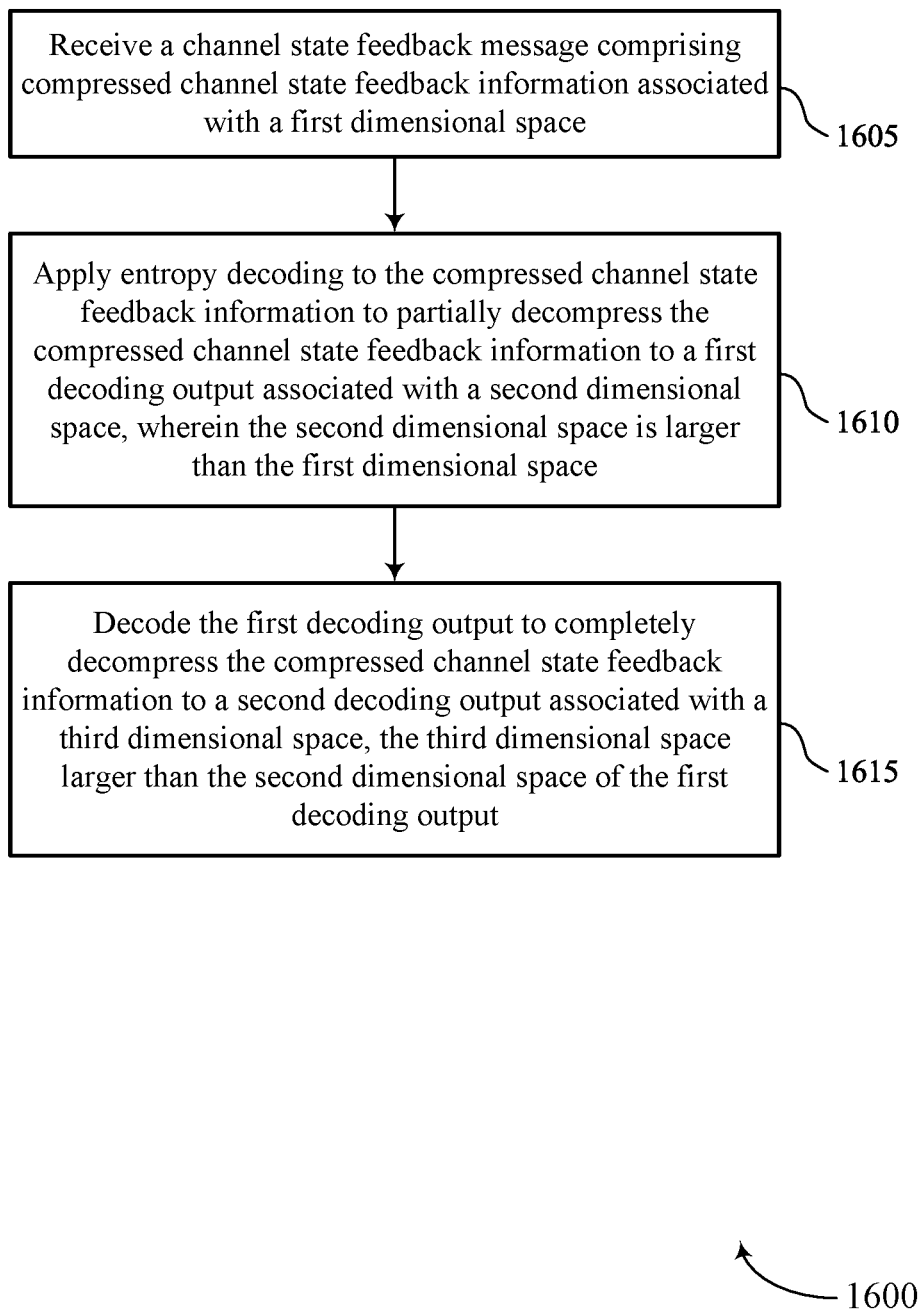

FIG. 16 shows a flowchart illustrating a method 1600 that supports techniques for encoding and decoding a channel between wireless communication devices in accordance with aspects of the present disclosure. The operations of the method 1600 may be implemented by a network device or its components as described herein. For example, the operations of the method 1600 may be performed by a network device as described with reference to FIGS. 1 through 5 and 10 through 13. In some examples, a network device may execute a set of instructions to control the functional elements of the network device to perform the described functions. Additionally, or alternatively, the network device may perform aspects of the described functions using special-purpose hardware.

At 1605, the method may include receiving a CSF message including compressed CSF information associated with a first dimensional space. The operations of 1605 may be performed in accordance with examples as disclosed herein. In some examples, aspects of the operations of 1605 may be performed by a CSF reception component 1225 as described with reference to FIG. 12.

At 1610, the method may include applying entropy decoding to the compressed CSF information to partially decompress the compressed CSF information to a first decoding output associated with a second dimensional space, where the second dimensional space is larger than the first dimensional space. The operations of 1610 may be performed in accordance with examples as disclosed herein. In some examples, aspects of the operations of 1610 may be performed by an entropy decoding component 1230 as described with reference to FIG. 12.

At 1615, the method may include decoding the first decoding output to completely decompress the compressed CSF information to a second decoding output associated with a third dimensional space, the third dimensional space larger than the second dimensional space of the first decoding output. The operations of 1615 may be performed in accordance with examples as disclosed herein. In some examples, aspects of the operations of 1615 may be performed by a CSF decoding component 1235 as described with reference to FIG. 12.

Figure 17:
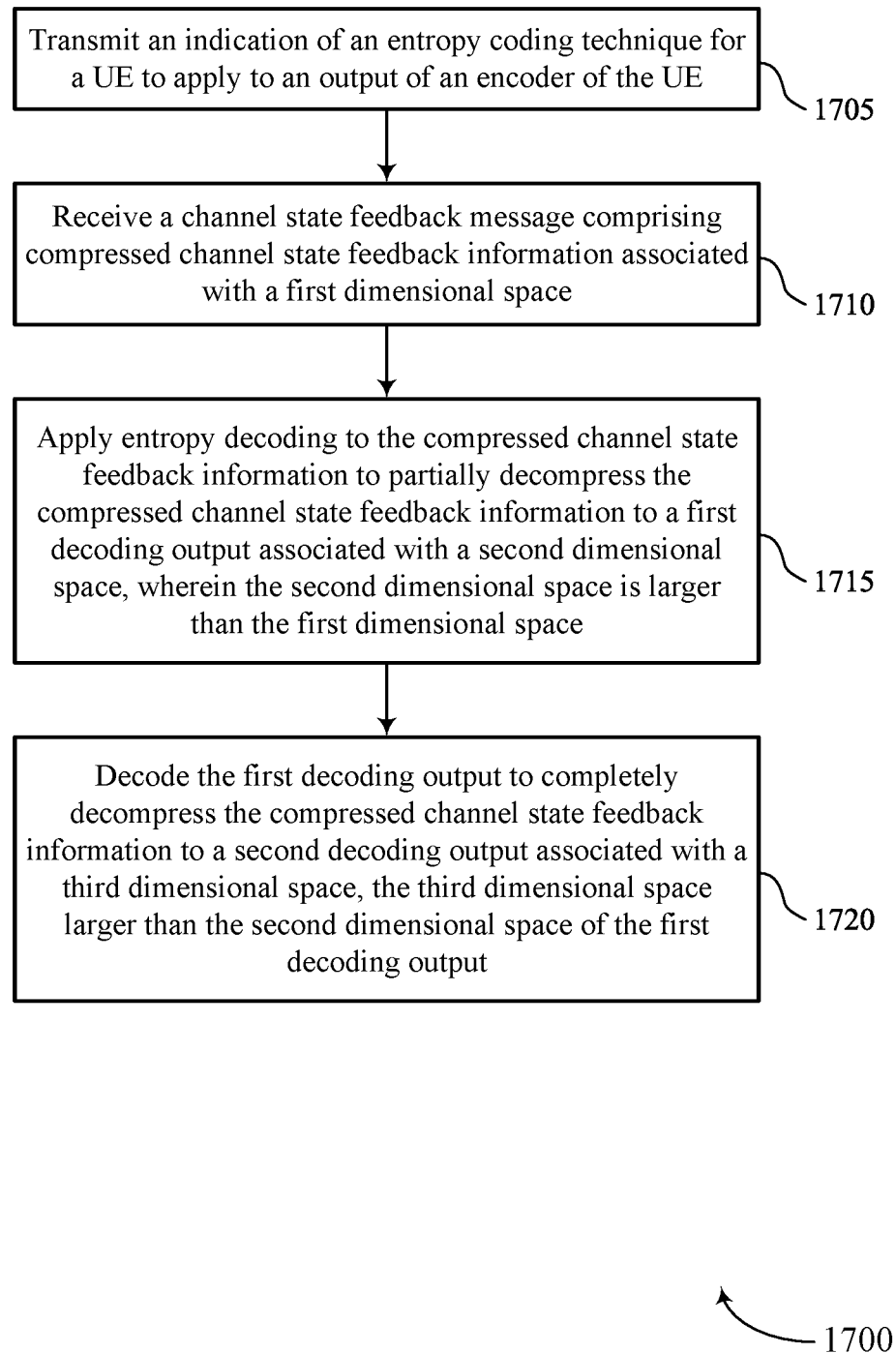

FIG. 17 shows a flowchart illustrating a method 1700 that supports techniques for encoding and decoding a channel between wireless communication devices in accordance with aspects of the present disclosure. The operations of the method 1700 may be implemented by a network device or its components as described herein. For example, the operations of the method 1700 may be performed by a network device as described with reference to FIGS. 1 through 5 and 10 through 13. In some examples, a network device may execute a set of instructions to control the functional elements of the network device to perform the described functions. Additionally, or alternatively, the network device may perform aspects of the described functions using special-purpose hardware.

At 1705, the method may include transmitting an indication of an entropy coding technique for a UE, which may be a machine learning or non-machine learning based method, to apply to an output of an encoder of the UE. The operations of 1705 may be performed in accordance with examples as disclosed herein. In some examples, aspects of the operations of 1705 may be performed by an entropy coding indication component 1245 as described with reference to FIG. 12.

At 1710, the method may include receiving a CSF message including compressed CSF information associated with a first dimensional space. The operations of 1710 may be performed in accordance with examples as disclosed herein. In some examples, aspects of the operations of 1710 may be performed by a CSF reception component 1225 as described with reference to FIG. 12.

At 1715, the method may include applying entropy decoding to the compressed CSF information to partially decompress the compressed CSF information to a first decoding output associated with a second dimensional space, where the second dimensional space is larger than the first dimensional space. The operations of 1715 may be performed in accordance with examples as disclosed herein. In some examples, aspects of the operations of 1715 may be performed by an entropy decoding component 1230 as described with reference to FIG. 12.

At 1720, the method may include decoding the first decoding output to completely decompress the compressed CSF information to a second decoding output associated with a third dimensional space, the third dimensional space larger than the second dimensional space of the first decoding output. The operations of 1720 may be performed in accordance with examples as disclosed herein. In some examples, aspects of the operations of 1720 may be performed by a CSF decoding component 1235 as described with reference to FIG. 12.

The following provides an overview of aspects of the present disclosure:

Aspect 1: A method for wireless communications at a UE, comprising: encoding channel state feedback information associated with the UE to compress the channel state feedback information to a first encoding output associated with a first dimensional space; applying entropy coding to the first encoding output of the channel state feedback information, wherein the entropy coding transforms the first encoding output to a second encoding output associated with a second dimensional space that is smaller than the first dimensional space of the first encoding output; and transmitting a channel state feedback message comprising the second encoding output.

Aspect 2: The method of aspect 1, further comprising: receiving an indication of a size of the first dimensional space, wherein the UE encodes the channel state feedback information based at least in part on the indication.

Aspect 3: The method of any of aspects 1 through 2, further comprising: receiving an indication of a size of the second dimensional space, wherein the UE applies the entropy coding to the first encoding output based at least in part on the indication.

Aspect 4: The method of any of aspects 1 through 3, further comprising: receiving an indication of an entropy coding technique, wherein the UE applies the entropy coding to the first encoding output based at least in part on the indication.

Aspect 5: The method of aspect 4, wherein the entropy coding technique is a machine-learning based technique, the machine-learning based technique comprises training a set of one or more parameters with a dataset associated with the set of one or more parameters.

Aspect 6: The method of aspect 5, wherein the entropy coding technique is trained together with an encoder of the UE and a universal decoder of a network device.

Aspect 7: The method of any of aspects 5 through 6, wherein the entropy coding technique is trained separately from an encoder of the UE, a universal decoder of a network device, or both.

Aspect 8: The method of any of aspects 1 through 7, wherein the UE is configured with one or more encoders for encoding the channel state feedback information, the one or more encoders each configured to be compatible with a universal decoder at a network device.

Aspect 9: The method of aspect 8, wherein each encoder of the one or more encoders is implemented by a neural network that utilizes machine-learning to compress the channel state feedback information to the first encoding output.

Aspect 10: The method of any of aspects 8 through 9, wherein each of the one or more encoders is associated with a different channel model, or corresponds to a different set of antenna ports, or corresponds to a different set of antenna panels, or a combination thereof.

Aspect 11: The method of any of aspects 1 through 10, further comprising: transmitting, to a network device, an indication of an index associated with the UE for the network device to use in decoding the channel state feedback message.

Aspect 12: The method of any of aspects 1 through 11, further comprising: transmitting, to a network device, an indication of a context vector for the network device to use in decoding the channel state feedback message, the context vector associated with one or more parameters of the UE.

Aspect 13: The method of any of aspects 1 through 12, wherein each point of the first dimensional space, the second dimensional space, or a combination thereof, maps to the channel state feedback information in a dimensional space larger than the first dimensional space.

Aspect 14: The method of any of aspects 1 through 13, further comprising: estimating a channel between the UE and a network device, wherein the channel state feedback information is based at least on part on estimating the channel.

Aspect 15: A method for wireless communications at a network device, comprising: receiving a channel state feedback message comprising compressed channel state feedback information associated with a first dimensional space; applying entropy decoding to the compressed channel state feedback information to partially decompress the compressed channel state feedback information to a first decoding output associated with a second dimensional space, wherein the second dimensional space is larger than the first dimensional space; and decoding the first decoding output to completely decompress the compressed channel state feedback information to a second decoding output associated with a third dimensional space, the third dimensional space larger than the second dimensional space of the first decoding output.

Aspect 16: The method of aspect 15, further comprising: transmitting an indication of a dimensional size of an output of an encoder of a UE.

Aspect 17: The method of any of aspects 15 through 16, further comprising: transmitting an indication of a dimensional size of an output of an entropy coding procedure to be performed by a UE, wherein the first dimensional space of the compressed channel state feedback information received by the network device is based at least in part on the dimensional size.

Aspect 18: The method of any of aspects 15 through 17, further comprising: transmitting an indication of an entropy coding technique for a UE to apply to an output of an encoder of the UE.

Aspect 19: The method of aspect 18, wherein the entropy coding technique is a machine-learning based technique, the machine-learning based technique comprises training a set of one or more parameters with a dataset associated with the set of one or more parameters.

Aspect 20: The method of aspect 19, wherein the entropy coding technique is trained together with the encoder of the UE and a universal decoder of the network device.

Aspect 21: The method of any of aspects 19 through 20, wherein the entropy coding technique is trained separately from the encoder of the UE, a universal decoder of the network device, or both.

Aspect 22: The method of any of aspects 15 through 21, wherein the network device is configured with a universal decoder for decoding channel state feedback information output from different encoders, the universal decoder compatible with each of the different encoders.

Aspect 23: The method of aspect 22, wherein the universal decoder is trained based at least in part on one or more defined inputs and one or more defined outputs for the universal decoder.

Aspect 24: The method of any of aspects 22 through 23, wherein the universal decoder is configured based at least in part on one or more parameters defined for the universal decoder.

Aspect 25: The method of any of aspects 22 through 24, wherein the universal decoder is implemented by a neural network that utilizes machine-learning to decompress the compressed channel state feedback information to the second decoding output.

Aspect 26: The method of any of aspects 15 through 25, wherein decoding the first decoding output further comprises: decoding the first decoding output by concatenating the first decoding output with an index associated with a UE.

Aspect 27: The method of aspect 26, further comprising: receiving an indication of the index associated with the UE for the network device to use in decoding the first decoding output.

Aspect 28: The method of any of aspects 26 through 27, further comprising: identifying the index associated with the UE for the network device to use in decoding the first decoding output, wherein identifying the index is based at least in part on a set of one or more resources over which the channel state feedback message is received by the network device.

Aspect 29: The method of any of aspects 15 through 28, wherein decoding the first decoding output further comprises: decoding the first decoding output by concatenating the first decoding output with a context vector, the context vector associated with one or more parameters of a UE.

Aspect 30: The method of aspect 29, further comprising: receiving an indication of the context vector for the network device to use in decoding the channel state feedback message.

Aspect 31: The method of any of aspects 15 through 30, wherein each point of the first dimensional space, the second dimensional space, or a combination thereof maps to the second decoding output of the third dimensional space.

Aspect 32: An apparatus for wireless communications at a UE, comprising a processor; memory coupled with the processor; and instructions stored in the memory and executable by the processor to cause the apparatus to perform a method of any of aspects 1 through 14.

Aspect 33: An apparatus for wireless communications at a UE, comprising at least one means for performing a method of any of aspects 1 through 14.

Aspect 34: A non-transitory computer-readable medium storing code for wireless communications at a UE, the code comprising instructions executable by a processor to perform a method of any of aspects 1 through 14.

Aspect 35: An apparatus for wireless communications at a network device, comprising a processor; memory coupled with the processor; and instructions stored in the memory and executable by the processor to cause the apparatus to perform a method of any of aspects 15 through 31.

Aspect 36: An apparatus for wireless communications at a network device, comprising at least one means for performing a method of any of aspects 15 through 31.

Aspect 37: A non-transitory computer-readable medium storing code for wireless communications at a network device, the code comprising instructions executable by a processor to perform a method of any of aspects 15 through 31.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a wide variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus for wireless communications at a user equipment (UE), comprising:
at least one processor;
at least one memory coupled with the at least one processor; and
instructions stored in the at least one memory and executable by the at least one processor to cause the apparatus to:
encode channel state feedback information associated with the UE to compress the channel state feedback information to a first encoding output associated with a first dimensional space;
apply entropy coding to the first encoding output of the channel state feedback information, wherein the entropy coding transforms the first encoding output to a second encoding output associated with a second dimensional space that is smaller than the first dimensional space of the first encoding output; and
transmit a channel state feedback message comprising the second encoding output;
wherein the instructions are further executable by the at least one processor to cause the apparatus to perform one or more of:
(i) receive an indication of a size of the first dimensional space, wherein the UE encodes the channel state feedback information based at least in part on the indication;
(ii) receive an indication of a size of the second dimensional space, wherein the UE applies the entropy coding to the first encoding output based at least in part on the indication; and
(iii) receive an indication of an entropy coding technique; and apply the entropy coding to the first encoding output based at least in part on the indication.

2. The apparatus of claim 1, wherein:
the entropy coding technique is a machine-learning based technique, and
wherein the instructions executable by the at least one processor to cause the apparatus to apply the entropy coding to the first encoding output are further executable by the at least one processor to cause the apparatus to train a set of one or more parameters with a dataset associated with the set of one or more parameters in accordance with the machine-learning based technique.

3. The apparatus of claim 2, wherein the entropy coding technique is trained together with an encoder of the UE and a universal decoder of a network device.

4. The apparatus of claim 2, wherein the entropy coding technique is trained separately from an encoder of the UE, a universal decoder of a network device, or both.

5. The apparatus of claim 1, wherein the UE is configured with one or more encoders for encoding the channel state feedback information, the one or more encoders each configured to be compatible with a universal decoder at a network device.

6. The apparatus of claim 5, wherein each encoder of the one or more encoders is implemented by a neural network that utilizes machine-learning to compress the channel state feedback information to the first encoding output.

7. The apparatus of claim 5, wherein each of the one or more encoders is associated with a different channel model, or corresponds to a different set of antenna ports, or corresponds to a different set of antenna panels, or a combination thereof.

8. The apparatus of claim 1, wherein the instructions are further executable by the at least one processor to cause the apparatus to:
transmit, to a network device, an indication of an index associated with the UE for the network device to use in decoding the channel state feedback message.

9. The apparatus of claim 1, wherein the instructions are further executable by the at least one processor to cause the apparatus to:
transmit, to a network device, an indication of a context vector for the network device to use in decoding the channel state feedback message, the context vector associated with one or more parameters of the UE.

10. An apparatus for wireless communications at a network device, comprising:
at least one processor;
at least one memory coupled with the at least one processor; and
instructions stored in the at least one memory and executable by the at least processor to cause the apparatus to:
receive a channel state feedback message comprising compressed channel state feedback information associated with a first dimensional space;
apply entropy decoding to the compressed channel state feedback information to partially decompress the compressed channel state feedback information to a first decoding output associated with a second dimensional space, wherein the second dimensional space is larger than the first dimensional space; and
decode the first decoding output to completely decompress the compressed channel state feedback information to a second decoding output associated with a third dimensional space, the third dimensional space larger than the second dimensional space of the first decoding output;
wherein the instructions are further executable by the at least one processor to cause the apparatus to perform one or more of:
(i) transmit an indication of a dimensional size of an output of an encoder of a user equipment (UE);
(ii) transmit an indication of a dimensional size of an output of an entropy coding procedure to be performed by a user equipment (UE), wherein the first dimensional space of the compressed channel state feedback information received by the network device is based at least in part on the dimensional size;
(iii) (iii)transmit an indication of an entropy coding technique for a user equipment (UE) to apply to an output of an encoder of the UE.

11. The apparatus of claim 10, wherein:
the entropy coding technique is a machine-learning based technique, and
wherein the instructions executable by the at least one processor to cause the apparatus to apply the entropy decoding to the compressed channel state feedback information are further executable by the at least one processor to cause the apparatus to train a set of one or more parameters with a dataset associated with the set of one or more parameters in accordance with the machine-learning based technique.

12. The apparatus of claim 11, wherein the entropy coding technique is trained together with the encoder of the UE and a universal decoder of the network device.

13. The apparatus of claim 11, wherein the entropy coding technique is trained separately from the encoder of the UE, a universal decoder of the network device, or both.

14. The apparatus of claim 10, wherein the network device is configured with a universal decoder for decoding channel state feedback information output from different encoders, the universal decoder compatible with each of the different encoders.

15. The apparatus of claim 14, wherein the universal decoder is trained based at least in part on one or more defined inputs and one or more defined outputs for the universal decoder.

16. The apparatus of claim 14, wherein the universal decoder is configured based at least in part on one or more parameters defined for the universal decoder.

17. The apparatus of claim 14, wherein the universal decoder is implemented by a neural network that utilizes machine-learning to decompress the compressed channel state feedback information to the second decoding output.

18. The apparatus of claim 10, wherein the instructions to decode the first decoding output are further executable by the at least one processor to cause the apparatus to:
    decode the first decoding output by concatenating the first decoding output with an index associated with a user equipment (UE).

19. The apparatus of claim 18, wherein the instructions are further executable by the at least one processor to cause the apparatus to:
    receive an indication of the index associated with the UE for the network device to use in decoding the first decoding output.

20. The apparatus of claim 18, wherein the instructions are further executable by the at least one processor to cause the apparatus to:
    identify the index associated with the UE for the network device to use in decoding the first decoding output, wherein identifying the index is based at least in part on a set of one or more resources over which the channel state feedback message is received by the network device.

21. The apparatus of claim 10, wherein the instructions to decode the first decoding output are further executable by the at least one processor to cause the apparatus to:
    decode the first decoding output by concatenating the first decoding output with a context vector, the context vector associated with one or more parameters of a user equipment (UE).

22. The apparatus of claim 21, wherein the instructions are further executable by the at least one processor to cause the apparatus to:
    receive an indication of the context vector for the network device to use in decoding the channel state feedback message.

23. A method for wireless communications at a user equipment (UE), comprising:
    encoding channel state feedback information associated with the UE to compress the channel state feedback information to a first encoding output associated with a first dimensional space;
    applying entropy coding to the first encoding output of the channel state feedback information, wherein the entropy coding transforms the first encoding output to a second encoding output associated with a second dimensional space that is smaller than the first dimensional space of the first encoding output;
    transmitting a channel state feedback message comprising the second encoding output; and one or more of:
    (i) receiving an indication of a size of the first dimensional space, wherein the UE encodes the channel state feedback information based at least in part on the indication;
    (ii) receiving an indication of a size of the second dimensional space, wherein the UE applies the entropy coding to the first encoding output based at least in part on the indication; and
    (iii) receiving an indication of an entropy coding technique; and
    applying the entropy coding to the first encoding output based at least in part on the indication.

24. A method for wireless communications at a network device, comprising:
    receiving a channel state feedback message comprising compressed channel state feedback information associated with a first dimensional space;
    applying entropy decoding to the compressed channel state feedback information to partially decompress the compressed channel state feedback information to a first decoding output associated with a second dimensional space, wherein the second dimensional space is larger than the first dimensional space;
    decoding the first decoding output to completely decompress the compressed channel state feedback information to a second decoding output associated with a third dimensional space, the third dimensional space larger than the second dimensional space of the first decoding output; and one or more of:
    (i) transmitting an indication of a dimensional size of an output of an encoder of a user equipment (UE);
    (ii) transmitting an indication of a dimensional size of an output of an entropy coding procedure to be performed by a user equipment (UE), wherein the first dimensional space of the compressed channel state feedback information received by the network device is based at least in part on the dimensional size;
    (iii) (iii)transmitting an indication of an entropy coding technique for a user equipment (UE) to apply to an output of an encoder of the UE.

* * * * *